United States Patent
Chen et al.

(10) Patent No.: US 11,791,401 B2
(45) Date of Patent: Oct. 17, 2023

(54) MULTI-GATE DEVICE AND RELATED METHODS

(71) Applicant: Taiwan Semiconductor Manufacturing Co., Ltd., Hsinchu (TW)

(72) Inventors: Shih-Cheng Chen, New Taipei (TW); Kuo-Cheng Chiang, Hsinchu County (TW); Zhi-Chang Lin, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 139 days.

(21) Appl. No.: 16/947,381

(22) Filed: Jul. 30, 2020

(65) Prior Publication Data
US 2022/0037506 A1     Feb. 3, 2022

(51) Int. Cl.
| H01L 29/66 | (2006.01) |
| H01L 21/8234 | (2006.01) |
| H01L 27/088 | (2006.01) |
| H01L 29/78 | (2006.01) |

(52) U.S. Cl.
CPC .. *H01L 29/6681* (2013.01); *H01L 21/823431* (2013.01); *H01L 21/823468* (2013.01); *H01L 27/0886* (2013.01); *H01L 29/66545* (2013.01); *H01L 29/66553* (2013.01); *H01L 29/785* (2013.01)

(58) Field of Classification Search
CPC ....... H01L 21/823468; H01L 29/66553; H01L 29/42392; H01L 29/66439; H01L 29/775
See application file for complete search history.

(56) References Cited

U.S. PATENT DOCUMENTS

| 8,796,666 | B1 | 8/2014 | Huang et al. |
| 8,815,712 | B2 | 8/2014 | Wan et al. |
| 8,963,258 | B2 | 2/2015 | Yu et al. |
| 9,093,530 | B2 | 7/2015 | Huang et al. |
| 9,171,929 | B2 | 10/2015 | Lee et al. |
| 9,214,555 | B2 | 12/2015 | Oxland et al. |
| 9,236,267 | B2 | 1/2016 | De et al. |
| 9,520,482 | B1 | 12/2016 | Chang et al. |
| 9,548,303 | B2 | 1/2017 | Lee et al. |

(Continued)

*Primary Examiner* — Tuan A Hoang
(74) *Attorney, Agent, or Firm* — HAYNES AND BOONE, LLP

(57) ABSTRACT

A method of fabricating a device includes providing a fin having a plurality of channel layers and a plurality of multilayer epitaxial layers interposing the plurality of channel layers. The multilayer epitaxial layers include a first epitaxial layer interposed between second and third epitaxial layers. The first epitaxial layer has a first etch rate and the second and third epitaxial layers have a second etch rate greater than the first etch rate. The method further includes laterally etching the first, second, and third epitaxial layers to provide a convex sidewall profile on opposing lateral surfaces of the multilayer epitaxial layers. The method further includes forming an inner spacer between adjacent channel layers. The inner spacer interfaces the convex sidewall profile of the multilayer epitaxial layers along a first inner spacer sidewall surface. The method further includes replacing the multilayer epitaxial layers with a portion of a gate structure.

20 Claims, 22 Drawing Sheets

(56) References Cited

U.S. PATENT DOCUMENTS

| | | | |
|---|---|---|---|
| 9,570,567 B1* | 2/2017 | Chang | H01L 29/66553 |
| 9,576,814 B2 | 2/2017 | Wu et al. | |
| 2008/0014688 A1* | 1/2008 | Thean | H01L 29/66636 |
| | | | 257/E21.431 |
| 2013/0285116 A1 | 10/2013 | Lochtefeld et al. | |
| 2018/0358435 A1* | 12/2018 | Mochizuki | H01L 29/0673 |
| 2019/0081155 A1* | 3/2019 | Xie | H01L 29/66553 |
| 2019/0097023 A1* | 3/2019 | Wu | B82Y 10/00 |
| 2019/0122937 A1* | 4/2019 | Cheng | H01L 21/823857 |
| 2019/0296127 A1* | 9/2019 | Cheng | H01L 29/78618 |

* cited by examiner

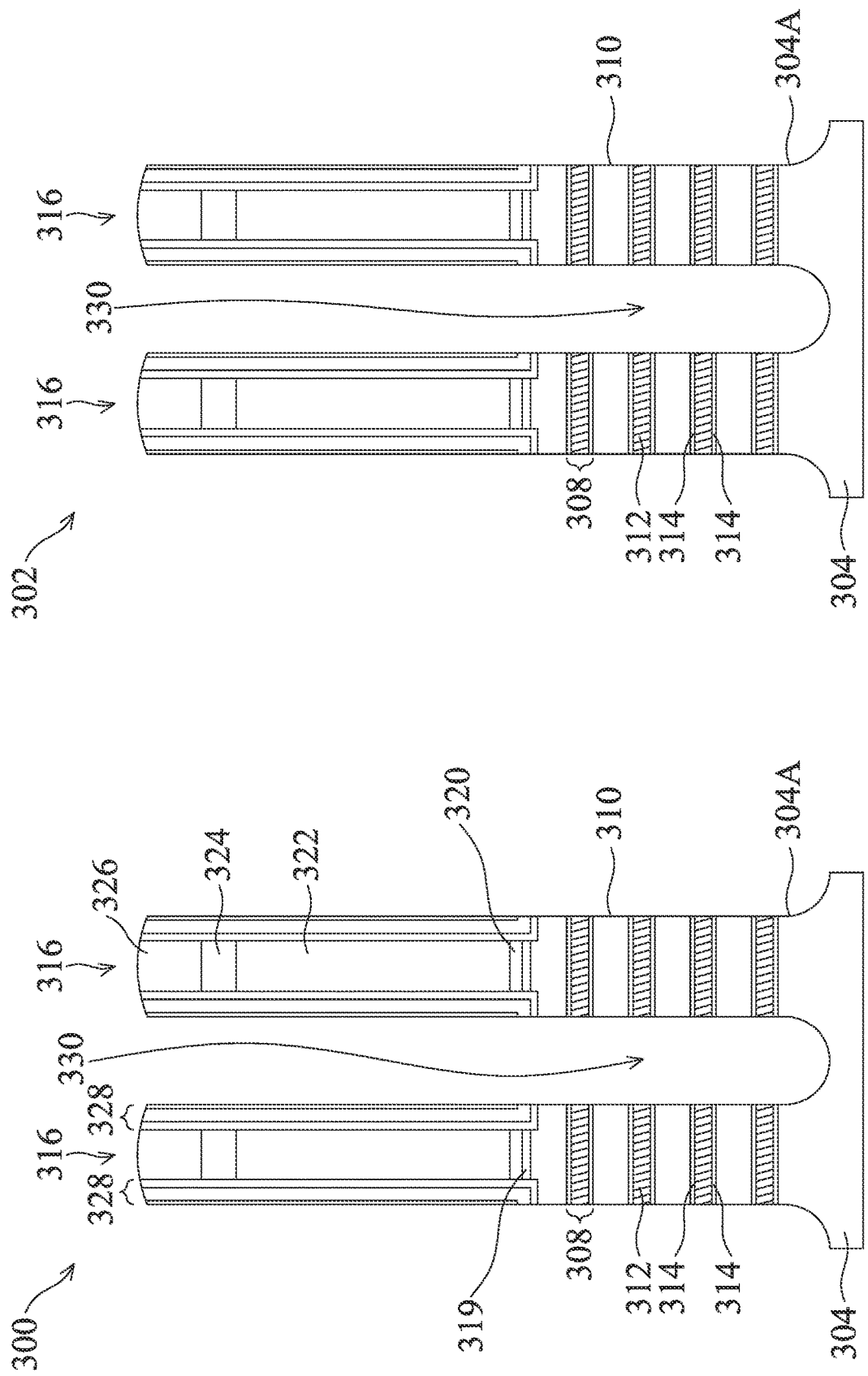

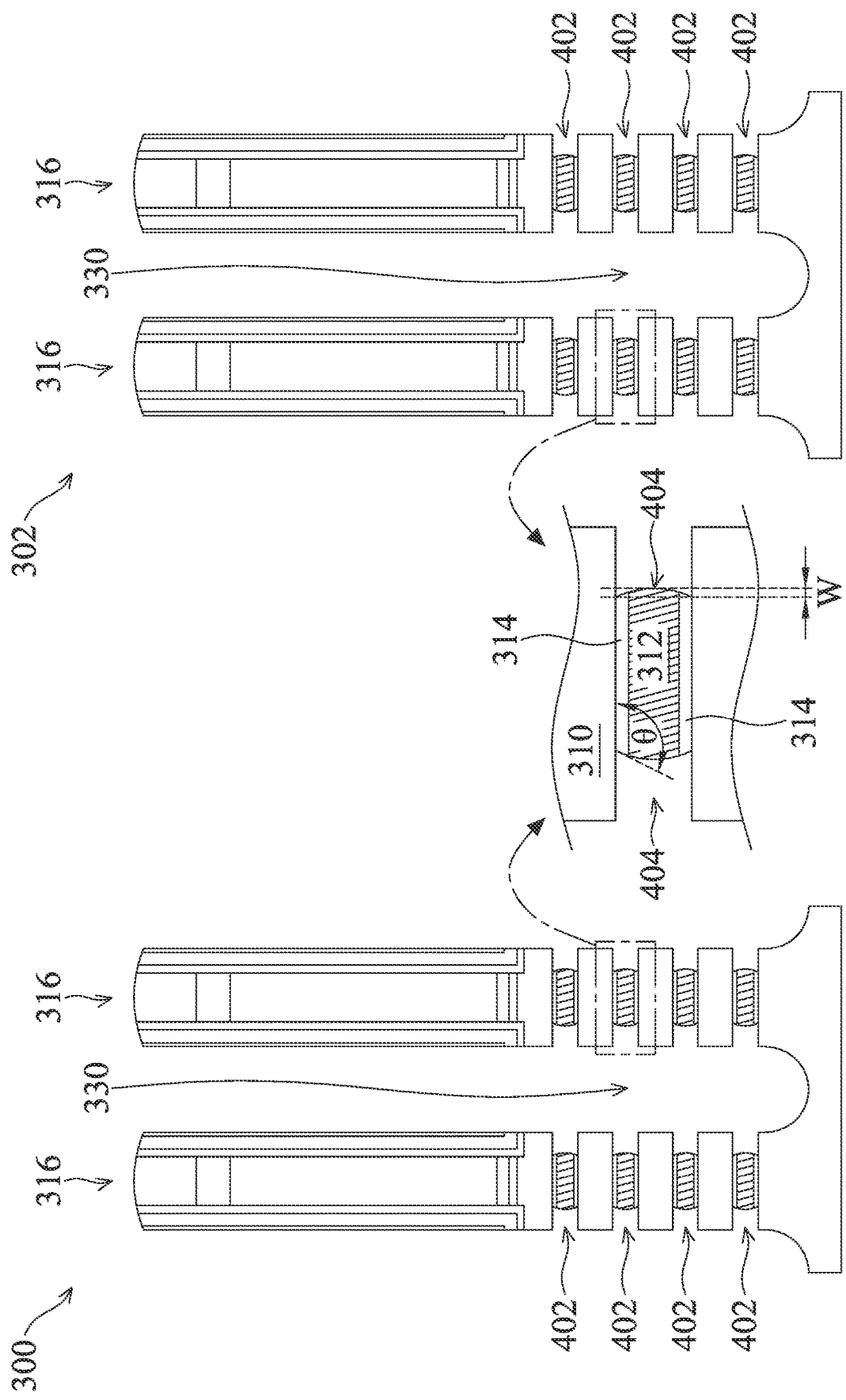

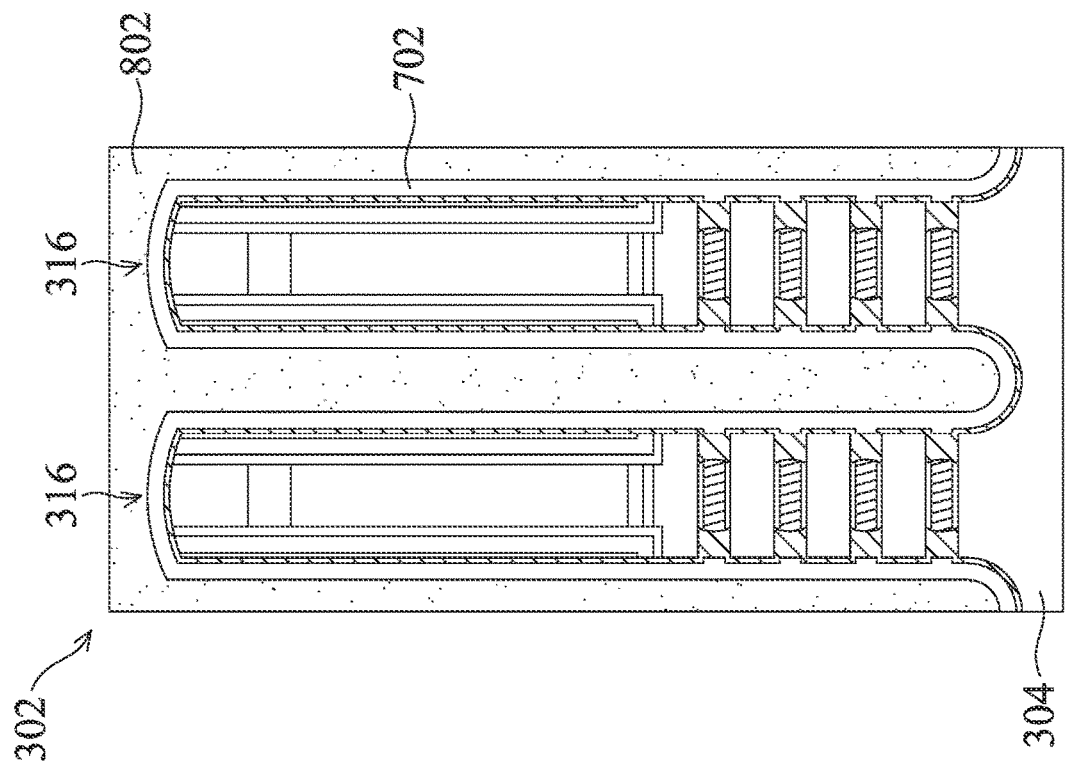
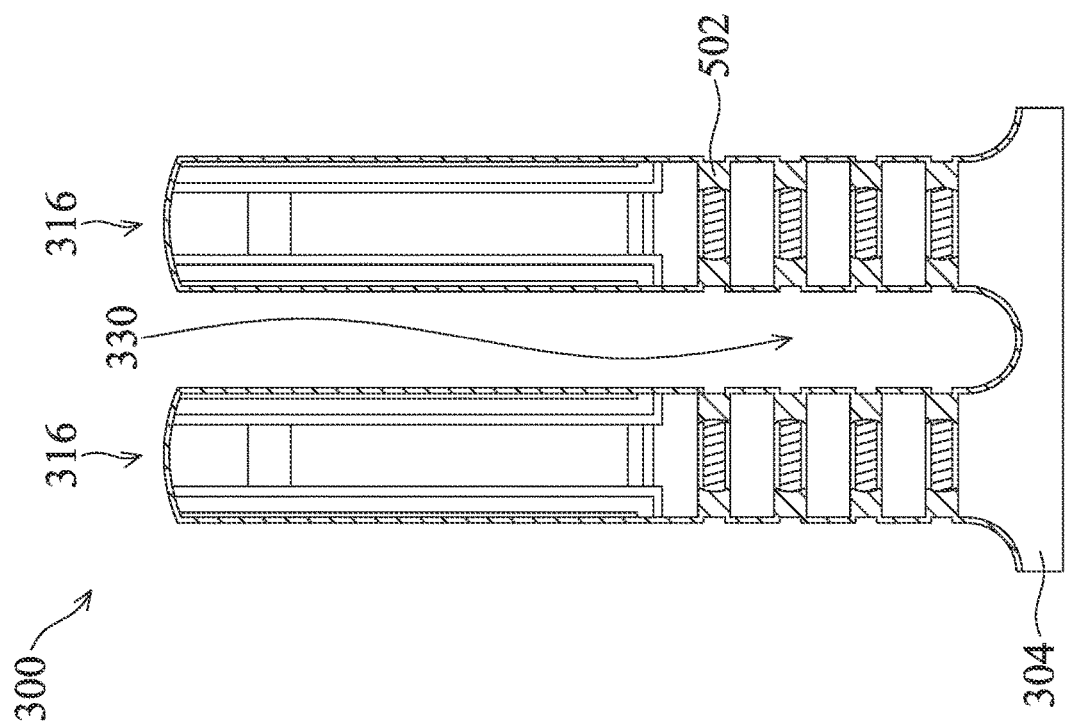

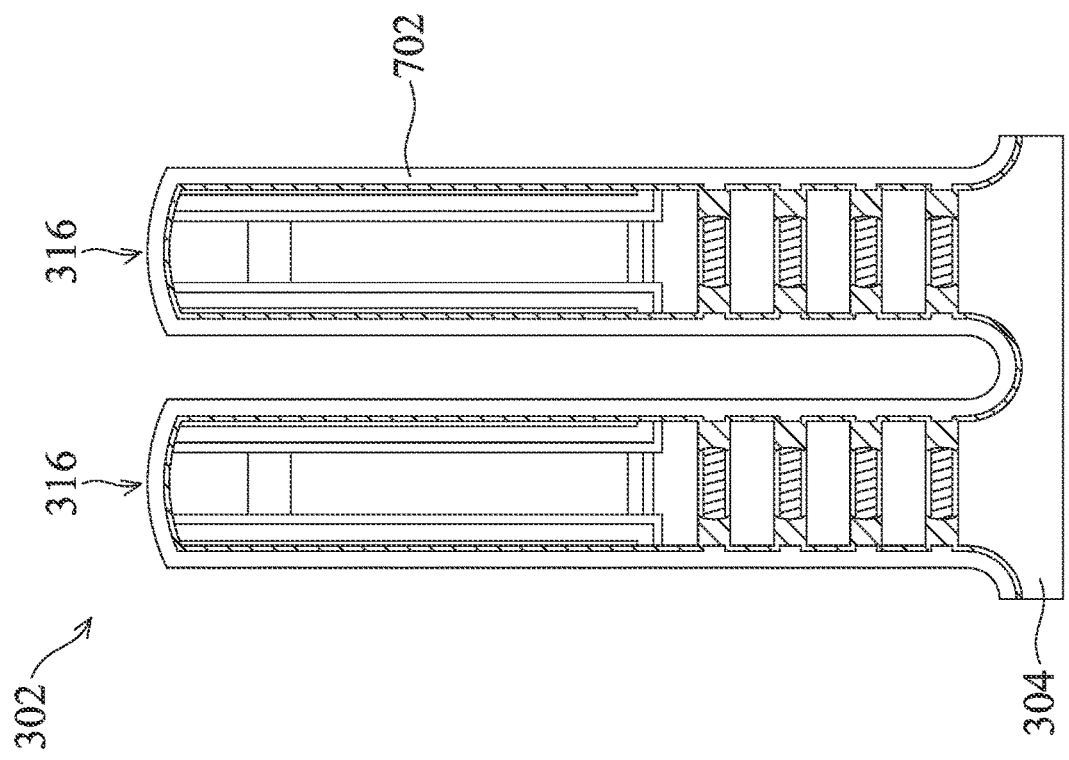
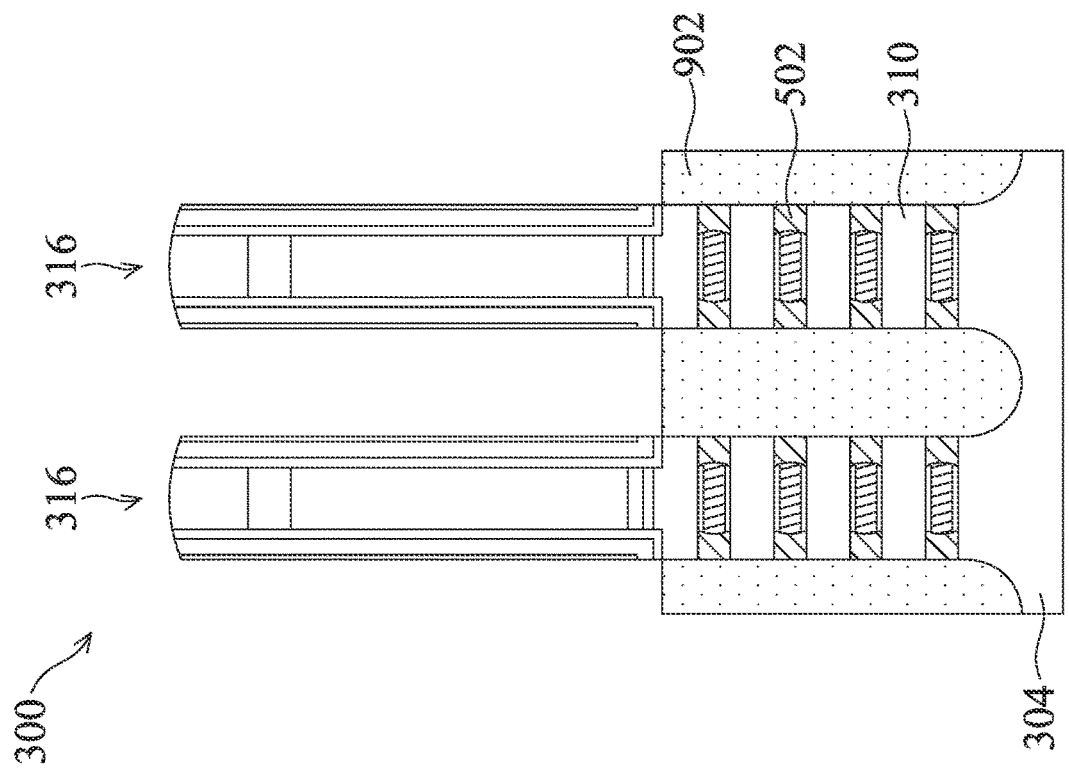
FIG. 9A
FIG. 9B

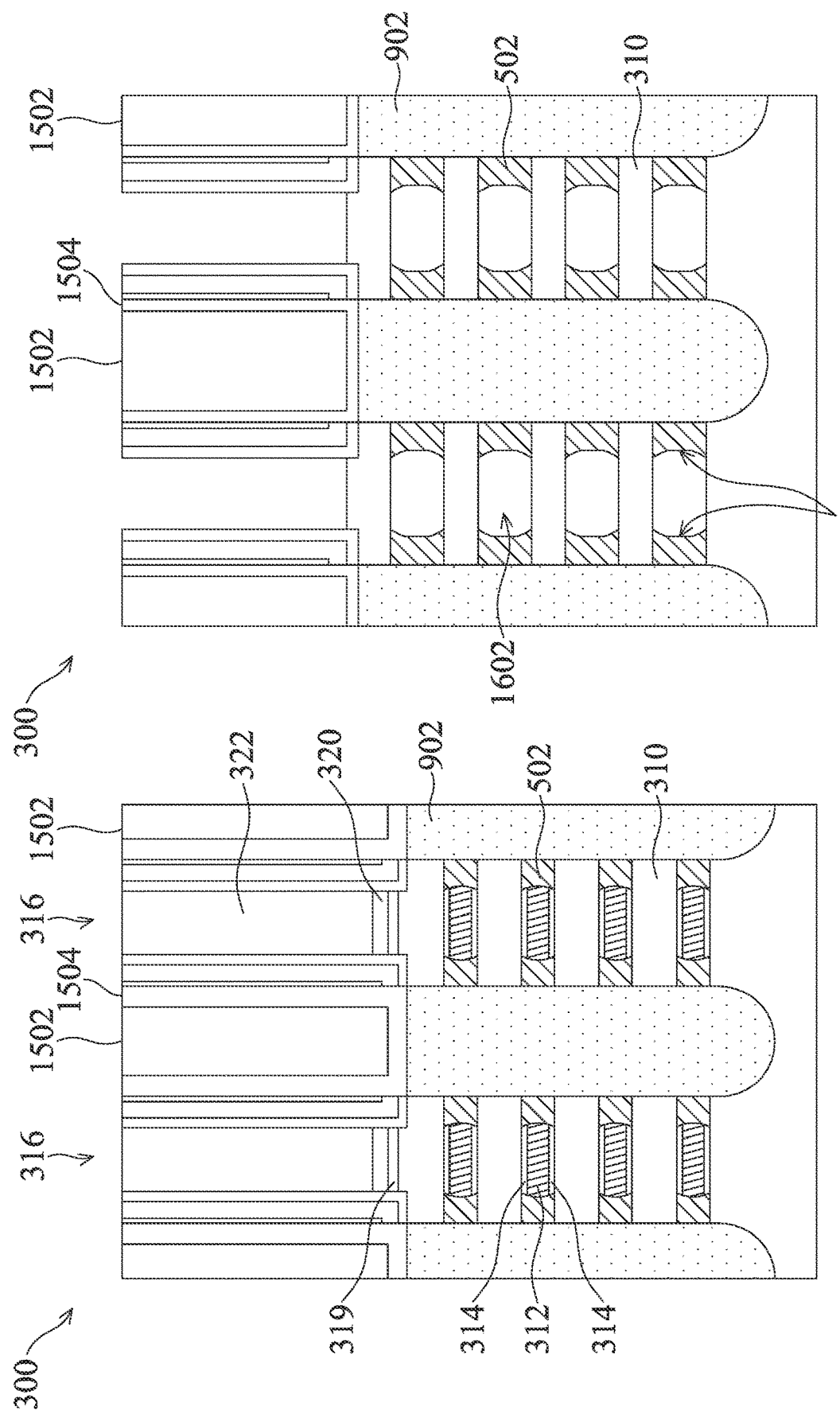

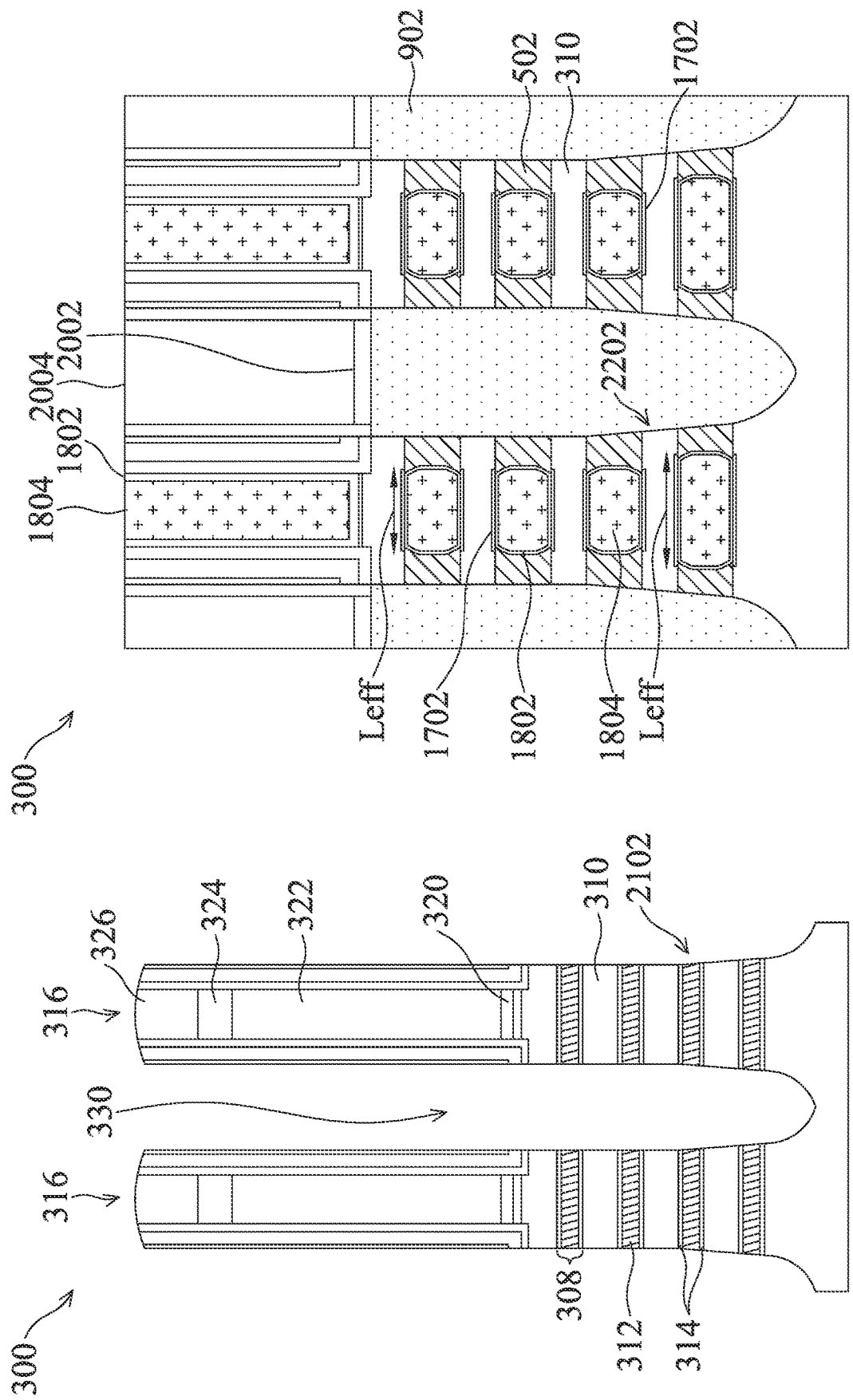

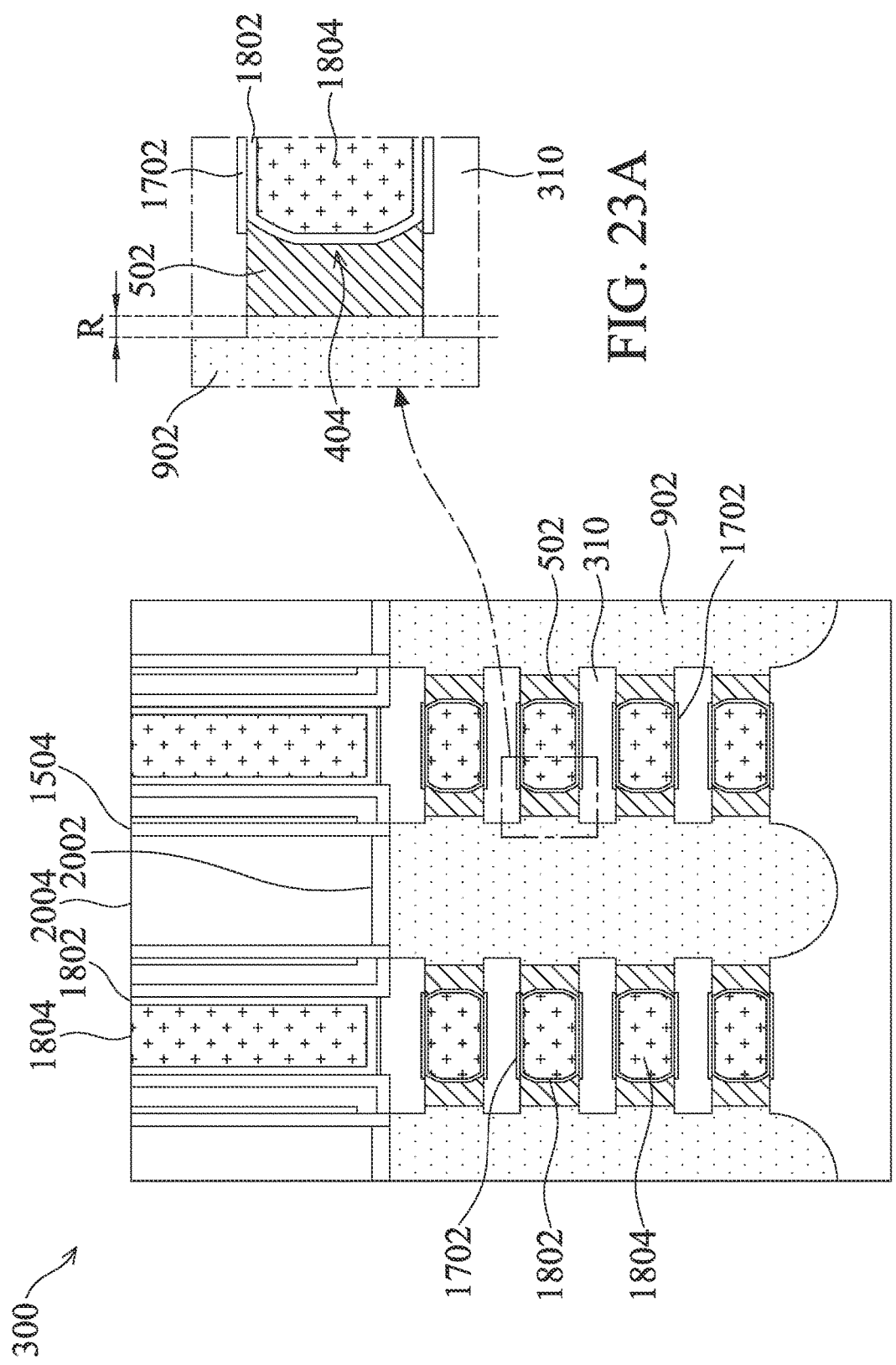

MULTI-GATE DEVICE AND RELATED METHODS

BACKGROUND

The electronics industry has experienced an ever-increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). One such multi-gate device that has been introduced is the fin field-effect transistor (FinFET). The FinFET gets its name from the fin-like structure which extends from a substrate on which it is formed, and which is used to form the FET channel. Another multi-gate device, introduced in part to address performance challenges associated with FinFETs, is the gate-all-around (GAA) transistor. GAA transistors get their name from the gate structure which extends completely around the channel, providing better electrostatic control than FinFETs. FinFETs and GAA transistors are compatible with conventional complementary metal-oxide-semiconductor (CMOS) processes and their three-dimensional structure allows them to be aggressively scaled while maintaining gate control and mitigating SCEs.

In general, GAA transistors may be implemented, for example, in cases where FinFETs can no longer meet performance requirements. However, fabrication of GAA transistors has introduced new challenges to the semiconductor manufacturing process and has led to associated device reliability concerns. Thus, existing techniques have not proved entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A, 4A, 5A, 6A, 7A, 8A, 9A, 10A, 11A, 12A, 13A, 14A, 15, 16, 17, 18, 19, and 20, provide cross-sectional views of an embodiment of the semiconductor device 300 along a plane substantially parallel to a plane defined by section AA' of FIG. 1, in accordance with some embodiments;

FIGS. 3B, 4B, 5B, 6B, 7B, 8B, 9B, 10B, 11B, 12B, 13B, and 14B provide cross-sectional views of an embodiment of the semiconductor device 302 along a plane substantially parallel to a plane defined by section AA' of FIG. 1, in accordance with some embodiments;

FIG. 4C provides a zoomed-in view of portions of the semiconductor devices 300, 302 shown in FIGS. 4A/4B, in accordance with some embodiments;

FIG. 18A provides a zoomed-in view of a portion of the semiconductor device 300 shown in FIG. 18, in accordance with some embodiments;

FIGS. 21 and 22 illustrate a semiconductor device having tapered sidewall profiles, in accordance with some embodiments;

FIG. 23 illustrates a semiconductor device including a source/drain region having a T-shaped feature, in accordance with some embodiments;

FIG. 23A provides a zoomed-in view of a portion of the semiconductor device shown in FIG. 23, in accordance with some embodiments;

DETAILED DESCRIPTION

Figure 1:
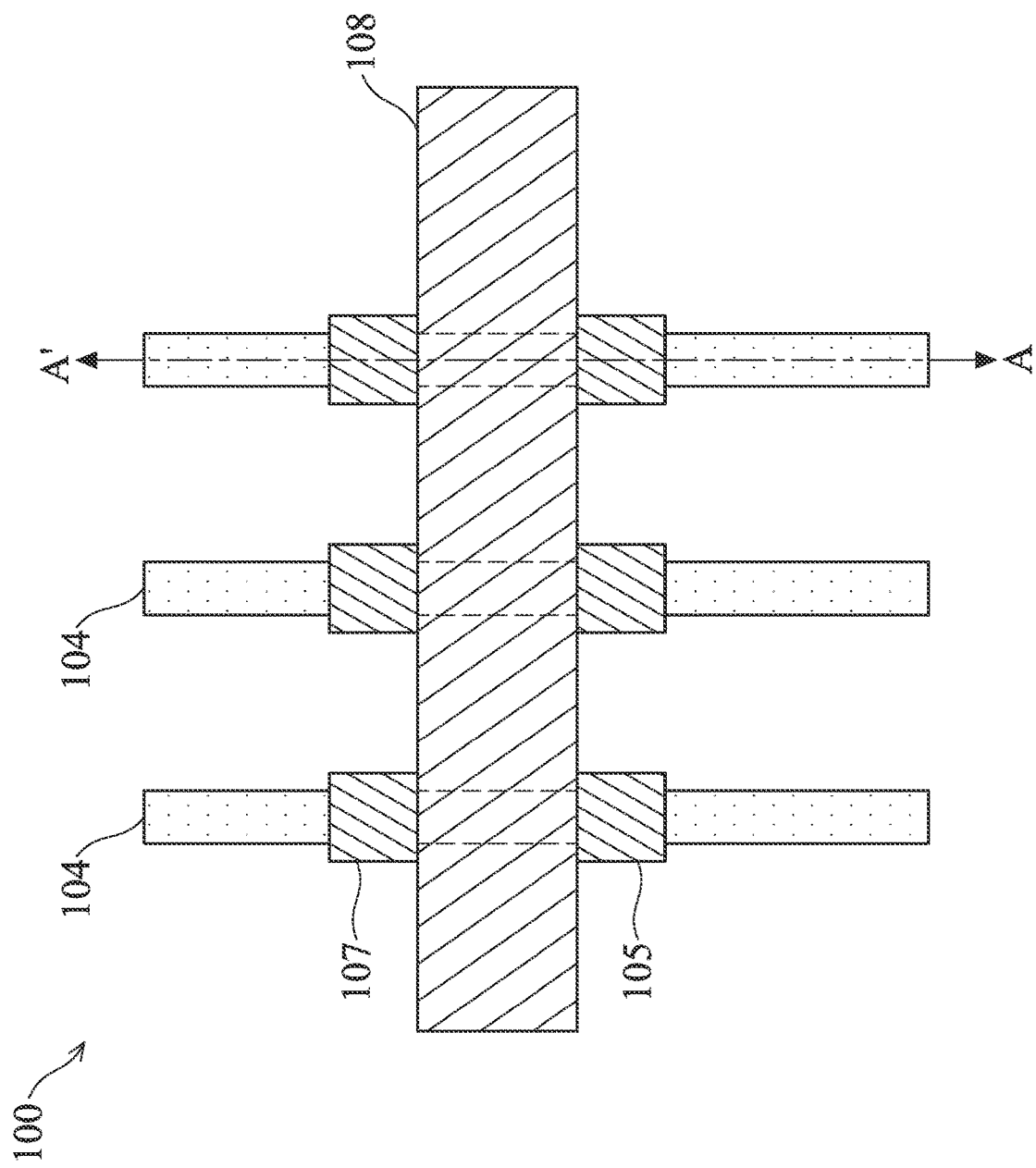
FIG. 1 provides a simplified top-down layout view of a multi-gate device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is also noted that the present disclosure presents embodiments in the form of multi-gate transistors. Multi-gate transistors include those transistors whose gate structures are formed on at least two-sides of a channel region. These multi-gate devices may include a P-type metal-oxide-semiconductor device or an N-type metal-oxide-semiconductor multi-gate device. Specific examples may be presented and referred to herein as FinFETs, on account of their fin-like structure. Also presented herein are embodiments of a type of multi-gate transistor referred to as a gate-all-around (GAA) transistor. A GAA transistor includes any device that has its gate structure, or portion thereof, formed on 4-sides of a channel region (e.g., surrounding a portion of a channel region). Devices presented herein also include embodiments that have channel regions disposed in semiconductor channel layers. In various embodiments, the semiconductor channel layers may include nanosheet channel(s), nanowire channel(s), bar-shaped channel(s), and/or other suitable channel configurations. Presented herein are embodiments of devices that may have one or more channel regions (e.g., semiconductor channel layers) associated with a single, contiguous gate structure. However, one of ordinary skill would recognize that the teaching can apply to a single channel (e.g., single semiconductor channel layer) or any number of channels. One of ordinary skill may recognize other examples of semiconductor devices that may benefit from aspects of the present disclosure.

Embodiments of the present disclosure offer advantages over the existing art, though it is understood that other embodiments may offer different advantages, not all advantages are necessarily discussed herein, and no particular advantage is required for all embodiments. For example, embodiments discussed herein include methods and structures for providing multi-gate devices (e.g., such as a GAA transistors) having an optimized inner spacer/metal gate layer interfacial profile. By way of example, inner spacers are formed interposing a metal gate layer and a source/drain feature. In at least some existing implementations, the metal gate layer interfacing the inner spacer has a concave sidewall profile such that the metal gate layer has substantially pointed end tip portions (e.g., at top and bottom regions of the concave sidewall profile of the metal gate layer). In some examples, and because of the pointed end tip portions (e.g., which can cause high electric field regions), some existing implementations result in degraded metal gate-to-source/drain reliability, while also causing poor high-K dielectric deposition at the inner spacer/metal gate layer interface (e.g., in some cases resulting in voids where the high-K dielectric was unable to be sufficiently deposited). In contrast, and in accordance with some embodiments, the metal gate layer interfacing the inner spacer has a convex sidewall profile, avoiding the reliability issues associated with the pointed end tip portions of the metal gate layer while also providing for improved high-K dielectric deposition at the inner spacer/metal gate layer interface. In at least some embodiments, the convex sidewall profile may be initially formed during a SiGe recess process of a SiGe layer, where the SiGe layer includes a high/low Ge concentration bi-layer epitaxial layer and where the SiGe etch rate is dependent on Ge concentration. Other embodiments and advantages will be evident to those skilled in the art upon reading the present disclosure.

For purposes of the discussion that follows, FIG. 1 provides a simplified top-down layout view of a multi-gate device 100. In various embodiments, the multi-gate device 100 may include a FinFET device, a GAA transistor, or other type of multi-gate device. The multi-gate device 100 may include a plurality of fin elements 104 extending from a substrate, a gate structure 108 disposed over and around the fin elements 104, and source/drain regions 105, 107, where the source/drain regions 105, 107 are formed in, on, and/or surrounding the fins 104. A channel region of the multi-gate device 100, which may include a plurality of semiconductor channel layers (e.g., when the multi-gate device 100 includes a GAA transistor), is disposed within the fins 104, underlying the gate structure 108, along a plane substantially parallel to a plane defined by section AA' of FIG. 1. In some embodiments, sidewall spacers may also be formed on sidewalls of the gate structure 108. Various other features of the multi-gate device 100 are discussed in more detail below with reference to the method of FIG. 2.

Figure 2:
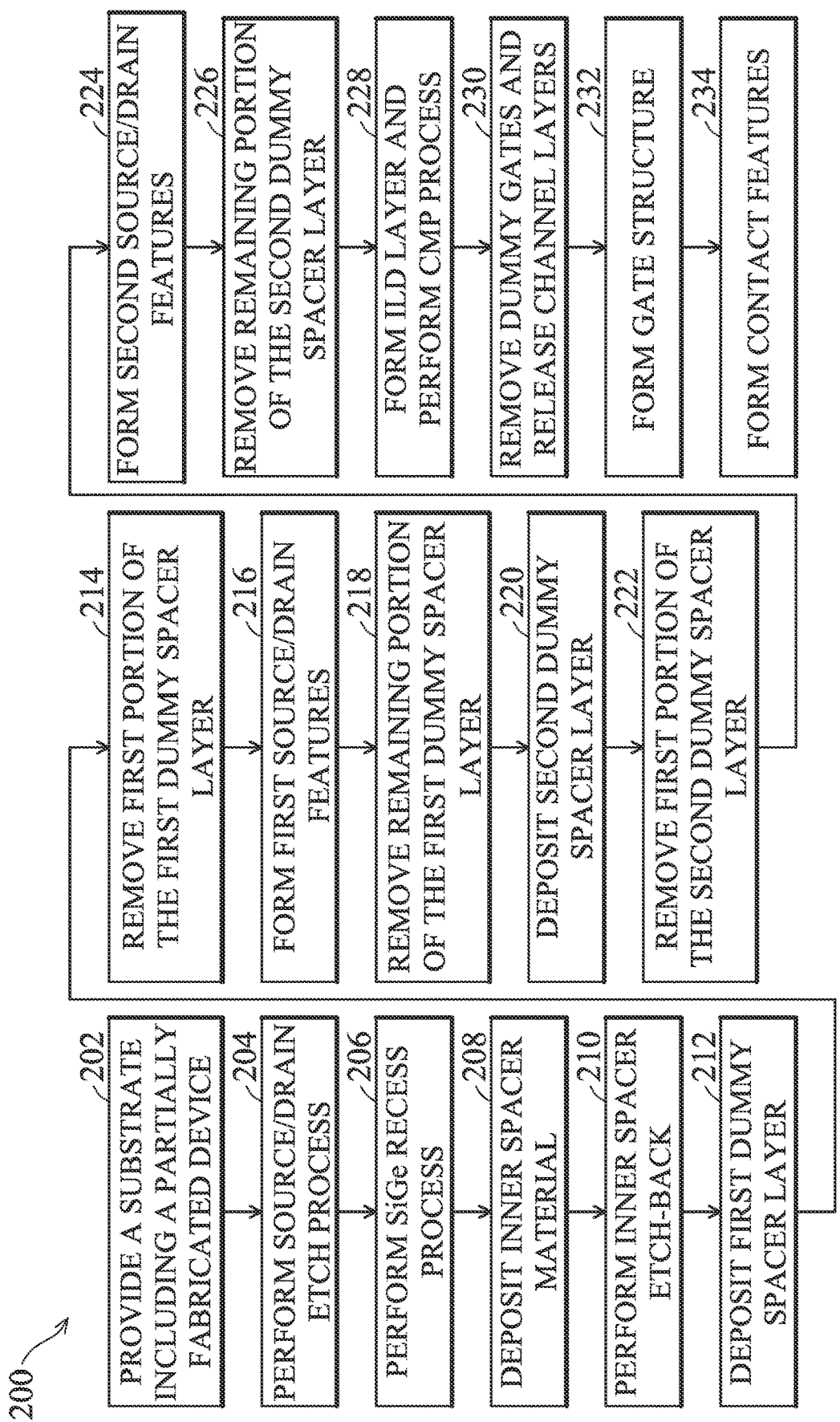
FIG. 2 is a flow chart of a method of fabricating semiconductor devices 300, 302 according to one or more aspects of the present disclosure.

Referring to FIG. 2, illustrated therein is a method 200 of semiconductor fabrication including fabrication of semiconductor devices 300, 302 (e.g., which include multi-gate devices) having an optimized inner spacer/metal gate layer interfacial profile, in accordance with various embodiments. The method 200 is discussed below with reference to fabrication of GAA transistors. However, it will be understood that aspects of the method 200 may be equally applied to other types of multi-gate devices, or to other types of devices implemented by the multi-gate devices, without departing from the scope of the present disclosure. In some embodiments, the method 200 may be used to fabricate the multi-gate device 100, described above with reference to FIG. 1. Thus, one or more aspects discussed above with reference to the multi-gate device 100 may also apply to the method 200. It is understood that the method 200 includes steps having features of a complementary metal-oxide-semiconductor (CMOS) technology process flow and thus, are only described briefly herein. Also, additional steps may be performed before, after, and/or during the method 200.

It is noted that certain aspects of the method 200 are described as being performed in a region of the semiconductor device 300, 302 including a particular device type (e.g., such as a P-type device or an N-type device). However, if not described as being performed in a region including a particular device type, the step of the method 200 being described may be assumed as being performed across a plurality of regions including a plurality of devices types (e.g., across a plurality of device type regions). Additionally, in at least some embodiments, the advantages of the convex sidewall profile of the metal gate layer interfacing the inner spacer may be beneficial for both P-type and N-type devices, and in some cases physical features of the device structures formed by the method 200 may be substantially the same for both P-type and N-type devices. Further, the semiconductor devices 300, 302 may include various other devices and features, such as other types of devices such as additional transistors, bipolar junction transistors, resistors, capacitors, inductors, diodes, fuses and/or other logic circuits, etc., but is simplified for a better understanding of the inventive concepts of the present disclosure. In some embodiments, the semiconductor devices 300, 302 include a plurality of semiconductor devices (e.g., transistors) which may be interconnected. Moreover, it is noted that the process steps of method 200, including any descriptions given with reference to the figures are merely exemplary and are not intended to be limiting beyond what is specifically recited in the claims that follow.

The method 200 begins at block 202 where a substrate including a partially fabricated device is provided. Referring to the example of FIG. 3A and FIG. 3B, in an embodiment of block 202, a partially fabricated P-type device 300 and a partially fabricated N-type device 302 are provided. FIG. 3A and FIG. 3B provide cross-sectional views of an embodiment of the semiconductor devices 300, 302 along a plane substantially parallel to a plane defined by section AA' of FIG. 1 (e.g., along the direction of a fin 306). The devices 300, 302 may be formed on a substrate 304. In some embodiments, the substrate 304 may be a semiconductor substrate such as a silicon substrate. The substrate 304 may include various layers, including conductive or insulating layers formed on a semiconductor substrate. The substrate 304 may include various doping configurations depending on design requirements as is known in the art. The substrate 304 may also include other semiconductors such as germanium, silicon carbide (SiC), silicon germanium (SiGe), or diamond. Alternatively, the substrate 304 may include a compound semiconductor and/or an alloy semiconductor. Further, the substrate 304 may optionally include an epitaxial layer (epi-layer), may be strained for performance enhancement, may include a silicon-on-insulator (SOI) structure, and/or have other suitable enhancement features.

As shown in FIGS. 3A/3B, the devices 300, 302 include a fin 306 having a substrate portion 304A (formed from the substrate 304), epitaxial layers 308 of a first composition and epitaxial layers 310 of a second composition that interpose the layers 308 of the first composition. In some cases, trench isolation (STI) features may be formed to isolate the fin 306 from neighboring fins. In an embodiment, the epitaxial layers 308 of the first composition include SiGe and the epitaxial layers of the second composition 310 include silicon (Si). In particular, the epitaxial layers 308 of the first composition further include constituent layers 312 and 314, where the layer 312 is interposed between the layers 314. Thus, in some embodiments, the epitaxial layers 308 may be referred to as multilayer epitaxial layers or as epitaxial layer stacks. In some examples, the layer 312 includes a SiGe layer having a first concentration of Ge, and the layers 314 include SiGe layers having a second concentration of Ge greater than the first concentration of Ge. For instance, in various embodiments, the layer 312 may include a SiGe layer having a Ge concentration in a range between about 15-35%, and the layers 314 may include SiGe layers having a Ge concentration in a range between about 25-40%. In some examples, a ratio of the Ge concentration in the layers 314 to the Ge concentration in the layer 312 is greater than about 1.2. As discussed in more detail below, the different Ge concentrations of each of the layers 312, 314 provide for differing etching rates during a subsequent SiGe recess process. In some embodiments, the layers 314 (with the higher Ge concentration) have a higher etching rate than the layers 312 (with the lower Ge concentration). By way of example, and because of the different etching rates of each of the layers 312 and 314, embodiments of the present disclosure provide for the formation of the optimized inner spacer/metal gate layer interfacial profile. It is also noted that while the layers 308, 310 are shown as having a particular stacking sequence within the fin 306, where the layer 310 is the topmost layer of the stack of layers 308, 310, other configurations are possible. For example, in some cases, the layer 308 may alternatively be the topmost layer of the stack of layers 308, 310. Stated another way, the order of growth for the layers 308, 310, and thus their stacking sequence, may be switched or otherwise be different than what is shown in the figures, while remaining within the scope of the present disclosure. Also, while the devices 300, 302 are illustrated as being formed on the same fin 306, it will be understood that the devices 300, 302 may be formed on different fins, each of which extends from the substrate 304.

In various embodiments, the epitaxial layers 310 (e.g., including the second composition), or portions thereof, may form a channel region of a GAA transistor of the devices 300, 302. For example, the layers 310 may be referred to as semiconductor channel layers that are used to form a channel region of a GAA transistor. In various embodiments, the semiconductor channel layers (e.g., the layers 310 or portions thereof) may include nanosheet channel(s), nanowire channel(s), bar-shaped channel(s), and/or other suitable channel configurations. The semiconductor channel layers are also used to form portions of the source/drain features of the GAA transistor, as discussed below.

It is noted that while the fin 306 is illustrated as including four (4) layers of the epitaxial layer 308 and four (4) layers of the epitaxial layer 310, this is for illustrative purposes only and not intended to be limiting beyond what is specifically recited in the claims. It can be appreciated that any number of epitaxial layers can be formed, where for example, the number of epitaxial layers depends on the desired number of semiconductor channel layers for the GAA transistor. In some embodiments, the number of epitaxial layers 310, and thus the number of semiconductor channel layers, is between 4 and 10.

In some embodiments, the epitaxial layers 312, 314 (of the epitaxial layer 308) have a thickness range of about 4-8 nanometers (nm). In some cases, the epitaxial layers 310 each have a thickness range of about 4-8 nm. As noted above, the epitaxial layers 310 may serve as channel region(s) for a subsequently-formed multi-gate device (e.g., a GAA transistor) and its thickness may be chosen based at least in part on device performance considerations. The epitaxial layers 308 may serve to define a gap distance between adjacent channel region(s) for the subsequently-formed multi-gate device and its thickness may also be chosen based at least in part on device performance considerations. Further, in some embodiments, the thicknesses of each of the layers 312, 314, which have different etching rates based on having different concentrations of Ge, may be chosen to provide a desired inner spacer/metal gate layer interfacial profile.

The devices 300, 302 further include gate stacks 316 formed over the fin 306 of each of the P-type device 300 and the N-type device 302. In an embodiment, the gate stacks 316 are dummy (sacrificial) gate stacks that are subsequently removed and replaced by the final gate stack at a subsequent processing stage of the devices 300, 302. For example, the gate stacks 316 may be replaced at a later processing stage by a high-K dielectric layer (HK) and metal gate electrode (MG). While the present discussion is directed to a replacement gate (gate-last) process whereby a dummy gate structure is formed and subsequently replaced, other configurations may be possible (e.g., such as a gate-first process). The portion of the fin 306 underlying the gate stacks 316 may be referred to as the channel region of the devices 300, 302. The gate stacks 316 may also define a source/drain region of the fin 306, for example, the regions of the fin 306 adjacent to and on opposing sides of the channel region.

In some embodiments, the gate stacks 316 include a dielectric layer 320 and an electrode layer 322. The gate stacks 316 may also include one or more hard mask layers 324, 326. In some embodiments, the hard mask layer 324 may include an oxide layer, and the hard mask layer 326 may include a nitride layer. In some embodiments, the dielectric layer 320 includes silicon oxide. Alternatively, or additionally, the dielectric layer 320 may include silicon nitride, a high-K dielectric material or other suitable material. In some embodiments, the electrode layer 322 may include polycrystalline silicon (polysilicon). In some embodiments, the oxide of the hard mask layer 324 includes a pad oxide layer that may include $SiO_2$. In some embodiments, the nitride of the hard mask layer 326 includes a pad nitride layer that may include $Si_3N_4$, silicon oxynitride or silicon carbide. In some examples, an optional sacrificial layer 319 may be formed directly beneath the dielectric layer 320. The optional sacrificial layer 319 may include SiGe, Ge, or other appropriate material, and may be used in some cases to prevent nanosheet loss (e.g., such as loss of material from the epitaxial layers 308, 310) during previous processing steps.

In some embodiments, one or more spacer layers 328 may be formed on sidewalls of the gate stacks 316. In some cases, one or more spacer layers 328 may include a dielectric material such as silicon oxide, silicon nitride, silicon carbide, silicon oxynitride, SiCN, silicon oxycarbide, SiOCN, a low-K material (e.g., with a dielectric constant 'k'<7), and/or combinations thereof. In some embodiments, the one or more spacer layers 328 includes multiple layers, such as main spacer layers, liner layers, and the like.

The method 200 then proceeds to block 204 where a source/drain etch process is performed. Still with reference to FIG. 3A and FIG. 3B, in an embodiment of block 204, a source/drain etch process is performed to the P-type device 300 and the N-type device 302. In some embodiments, the source/drain etch process is performed to remove the exposed epitaxial layers 308, 310 in source/drain regions of the P-type device 300 and the N-type device 302 to form trenches 330 which expose underlying portions of the substrate 304. The source/drain etch process also serves to expose lateral surfaces of the epitaxial layers 310, 312, 314, as shown in FIGS. 3A/3B. In some embodiments, the source/drain etch process may also remove portions of the one or more spacer layers 328 (e.g., from top surfaces of the gate stacks 316). In some embodiments, the source/drain etch process may include a dry etching process, a wet etching process, and/or a combination thereof. In various embodiments, the source/drain etch process may be performed simultaneously to the P-type device 300 and the N-type device 302. Alternatively, the source/drain etch process may be performed sequentially, for example, first to one of the P-type device 300 and the N-type device 302, and then to the other of the P-type device 300 and the N-type device 302.

The method 200 then proceeds to block 206 where a SiGe recess process is performed. Referring to FIGS. 3A/3B and FIGS. 4A/4B/4C, in an embodiment of block 206, a SiGe recess process is performed to the P-type device 300 and the N-type device 302. The SiGe recess process includes a lateral etch of the epitaxial layers 308 (including both constituent layers 312 and 314) within each of the P-type device 300 and the N-type device 302 to form recesses 402 (or opening 402). In some embodiments, the SiGe recess process is performed using a dry etching process, a wet etching process, and/or a combination thereof. In some cases, the SiGe recess process may include etching using a standard clean 1 (SC-1) solution, ozone ($O_3$), a solution of ammonium hydroxide ($NH_4OH$), hydrogen peroxide ($H_2O_2$) and water ($H_2O$), hydrofluoric acid (HF), buffered HF, and/or a fluorine ($F_2$)-based etch. In some examples, the $F_2$-based etch may include an $F_2$ remote plasma etch. As noted above, the layer 312 includes a SiGe layer having a first concentration of Ge (e.g., in a range between about 15-35%), and the layers 314 include SiGe layers having a second concentration of Ge (e.g., in a range between about 25-40%) and greater than the first concentration of Ge. In some embodiments, the layers 314 (with the higher Ge concentration) have a higher etching rate than the layers 312 (with the lower Ge concentration). Thus, during the SiGe recess process, the lateral etching of the layers 314 will proceed at a faster rate than the lateral etching of the layers 312. As a result of the lateral etching, each of the recessed (etched) SiGe layers 312, together with adjacent recessed SiGe layers 314 (e.g., that are in contact with top and bottom surfaces of a respective layer 312), define convex profiles 404 (FIG. 4C) along opposing lateral surfaces of the layers 312, 314. In various cases, the convex profiles 404 may be generally smooth profiles. Also, the convex profiles 404 may have a shape defined by an angle 'θ', where the angle 'θ' is measured between the surface of an adjacent epitaxial layer 310 and a tangent to the convex profile 404 (at an edge of the convex profile 404 that interfaces the adjacent epitaxial layer 310). By way of example, the angle 'θ' may be in a range of between about 90-120 degrees. The angle 'θ' may be determined at least in part by the etching rates, and thus by the Ge concentrations, of each of the layers 312 and 314. For example, as the difference in etching rates between the layer 312 and the layers 314 increases, the angle 'θ' increases. In some embodiments, the convex profile 404 spans a width 'W' of between about 0-3 nm. During a later stage of processing, as discussed below, the layers 312, 314 will be removed and replaced by a portion of a gate structure (e.g., a metal gate structure) such that the replacement gate structure defines the convex profile 404. In various examples, the replacement gate structure will interface an inner spacer, as also described in more detail below. In some embodiments, the SiGe recess process may be performed simultaneously to the P-type device 300 and the N-type device 302, or the SiGe recess process may be performed first to one of the P-type device 300 and the N-type device 302, and then to the other of the P-type device 300 and the N-type device 302.

The method 200 then proceeds to block 208 where deposition of an inner spacer material is performed. Referring to FIGS. 4A/4B and FIGS. 5A/5B, in an embodiment of block 208, an inner spacer material 502 is deposited over the devices 300, 302 and within the trenches 330. The deposited inner spacer material 502 is also deposited within the recesses 402 formed during the SiGe recess process of block 206. In some cases, the inner spacer material 502 may have a thickness of about 4-15 nm. In some embodiments, the inner spacer material 502 may include amorphous silicon. In some examples, the inner spacer material 502 may include a dielectric material such as silicon oxide, silicon nitride, silicon carbide, silicon oxynitride, SiCN, silicon oxycarbide, SiOCN, a low-K material (e.g., with a dielectric constant 'k'<7), and/or combinations thereof. By way of example, the inner spacer material 502 may be formed by conformally depositing the inner spacer material 502 over the devices 300, 302 using processes such as a CVD process, a subatmospheric CVD (SACVD) process, a flowable CVD process, an ALD process, a PVD process, or other suitable process. In some embodiments, the inner spacer material 502 may be deposited simultaneously over the P-type device 300 and the N-type device 302, or the inner spacer material 502 may be deposited first over one of the P-type device 300 and the N-type device 302, and then over the other of the P-type device 300 and the N-type device 302.

Figure 5A:
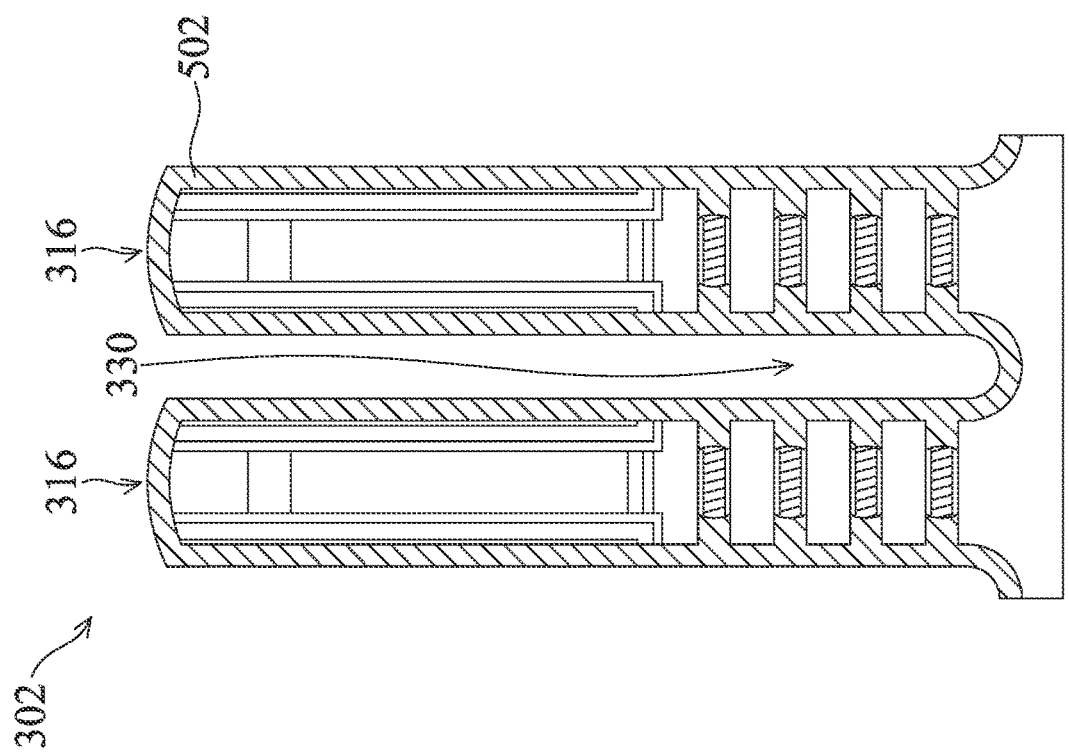
Figure 5B:
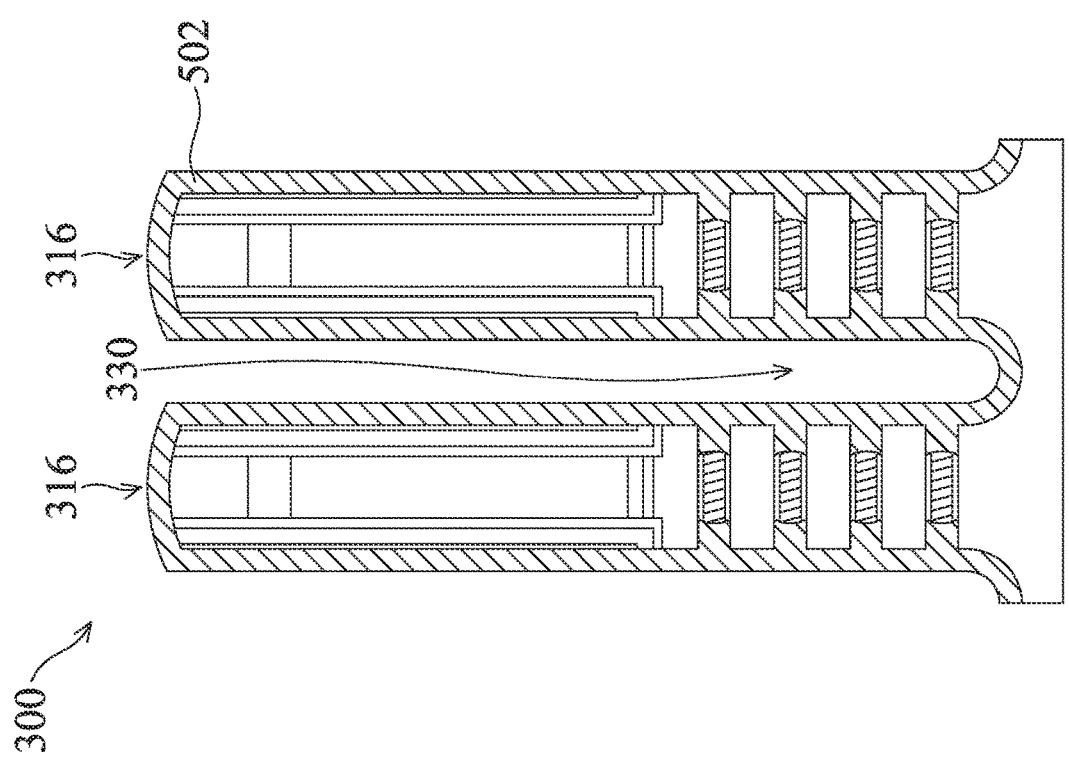

The method 200 then proceeds to block 210 where an inner spacer etch-back process is performed. Referring to FIGS. 5A/5B and FIGS. 6A/6B, in an embodiment of block 210, an inner spacer etch-back process may be performed to the P-type device 300 and the N-type device 302. In various examples, the inner spacer etch-back process etches the inner spacer material 502 from over the devices 300, 302 and along sidewalls of the trenches 330, while the inner spacer material 502 remains disposed within the recesses 402, thereby providing inner spacers for the devices 300, 302. By way of example, the inner spacer etch-back process may be performed using a wet etch process, a dry etch process, or a combination thereof. In some cases, any residual portions of the inner spacer material 502 that remain on top surfaces of the devices 300, 302 and/or on sidewalls or bottom surfaces of the trenches 330, for example after the inner spacer etch-back process, may be removed during subsequent processes (e.g., prior to epitaxial growth of source/drain features). In various examples, the inner spacer material 502 (e.g., that remains disposed within the recesses 402) may extend beneath the one or more spacer layers 328 (formed on sidewalls of the gate stacks 316) while abutting subsequently formed source/drain features, described below. In some embodiments, the inner spacer etch-back process may be performed simultaneously to the devices 300, 302, or the inner spacer etch-back process may be performed first to one of the device 300 and the device 302, and then to the other of the device 300 and the device 302.

Figure 6A:
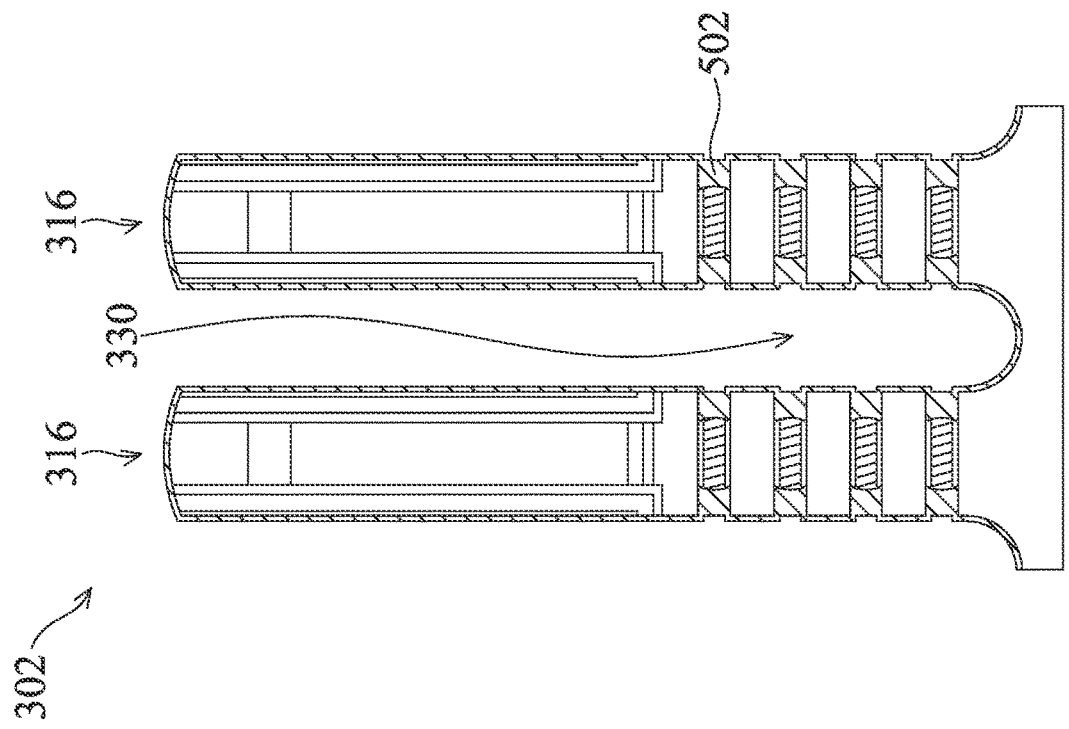
Figure 6B:
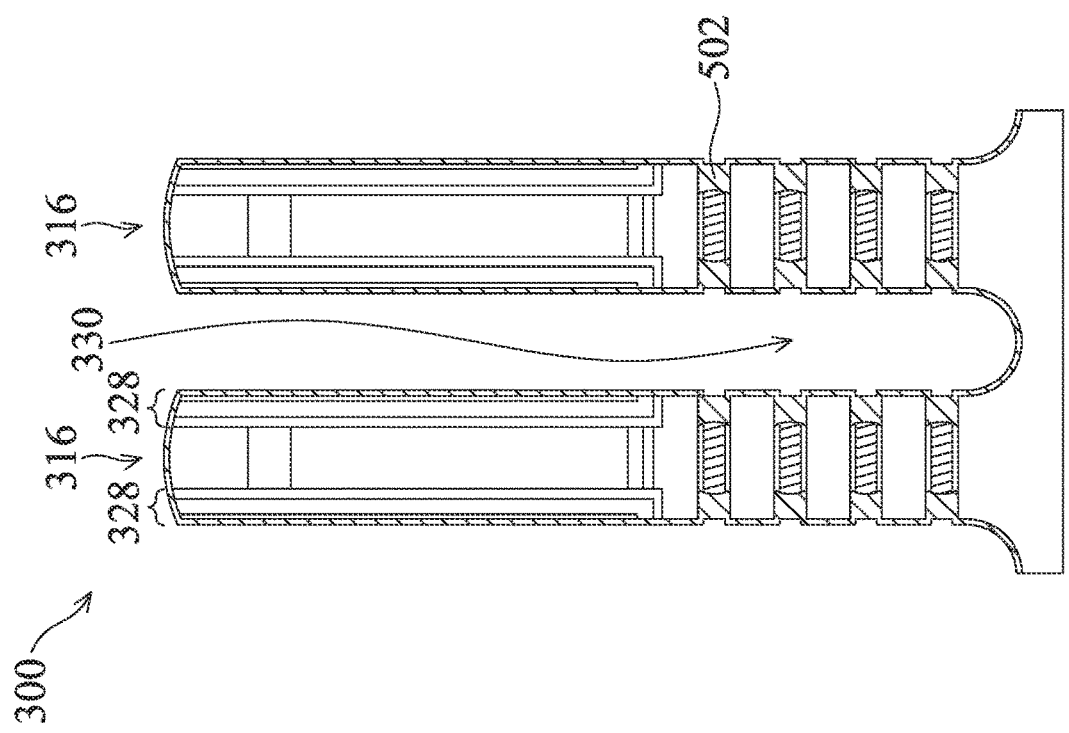

The method 200 then proceeds to block 212 where a first dummy spacer layer is deposited. Referring to FIGS. 6A/6B and FIGS. 7A/7B, in an embodiment of block 212, a first dummy spacer layer 702 is deposited over the devices 300, 302 and within the trenches 330. In some examples, the first dummy spacer layer 702 may include a dielectric material such as silicon oxide, silicon nitride, silicon carbide, silicon oxynitride, SiCN, silicon oxycarbide, SiOCN, a low-K material (e.g., with a dielectric constant 'k'<7), and/or combinations thereof. By way of example, the first dummy spacer layer 702 may be formed by conformally depositing the first dummy spacer layer 702 over the devices 300, 302 using processes such as a CVD process, an SACVD process, a flowable CVD process, an ALD process, a PVD process, or other suitable process. In some embodiments, the first dummy spacer layer 702 may be deposited simultaneously over the devices 300, 302, or the first dummy spacer layer 702 may be deposited first over one of the device 300 and the device 302, and then over the other of the device 300 and the device 302.

Figure 7A:
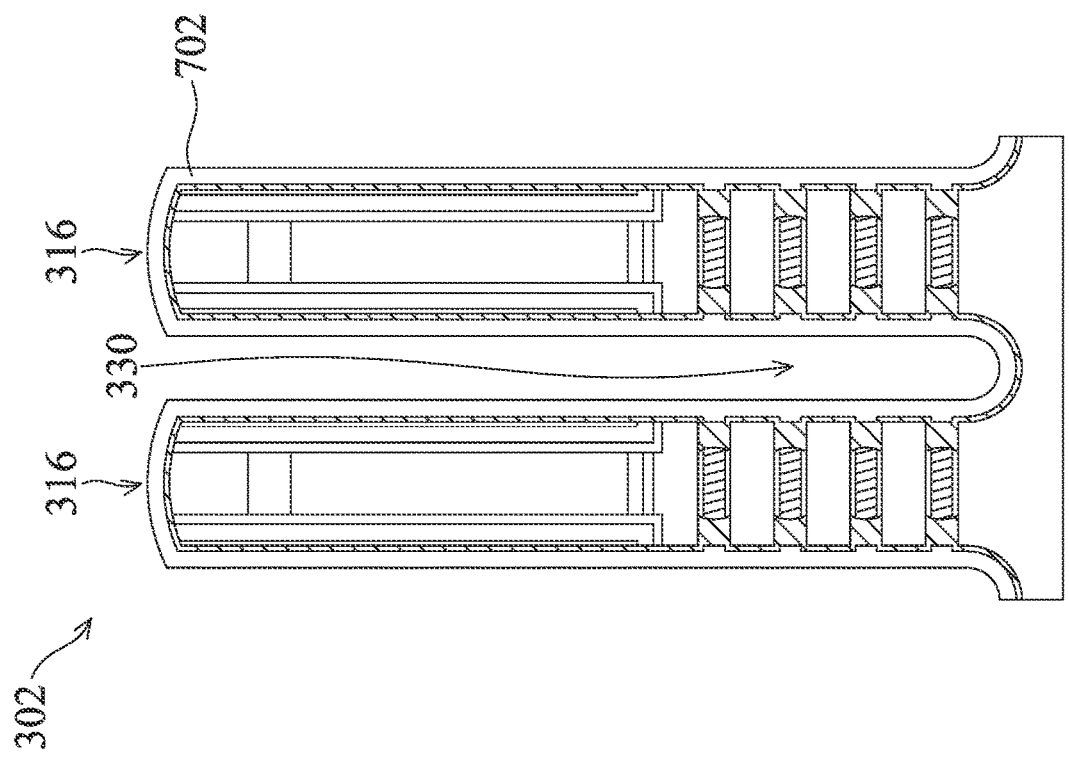
Figure 7B:
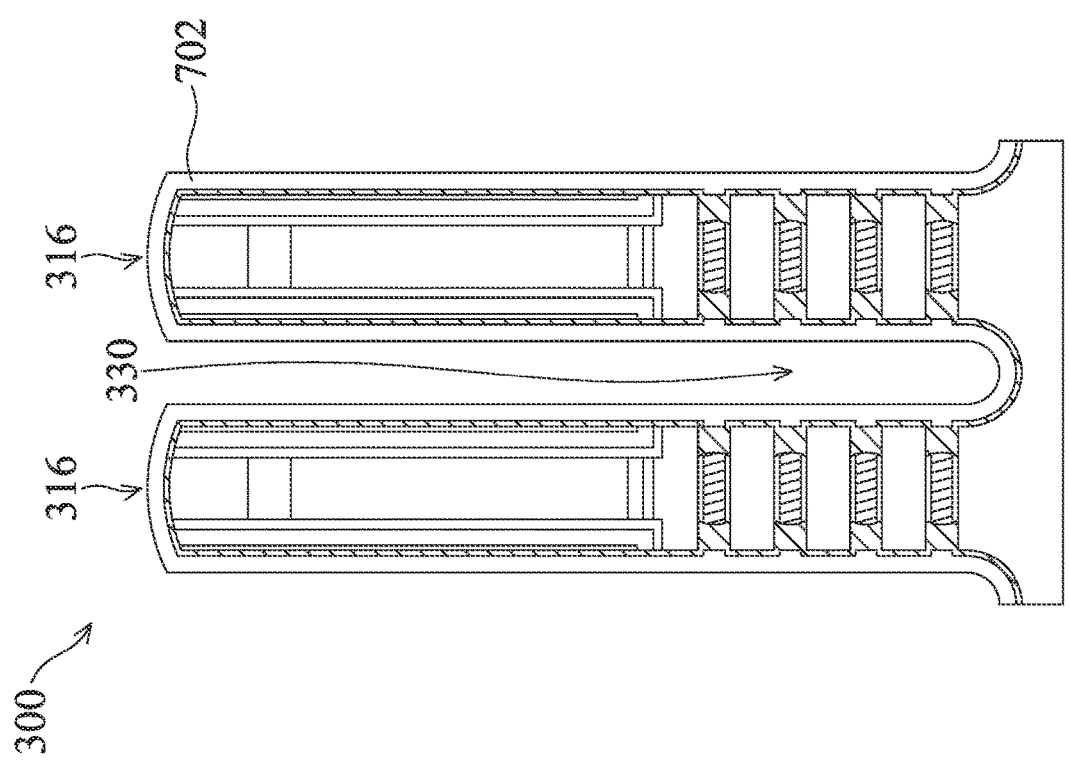

The method 200 then proceeds to block 214 where a first portion of the first dummy spacer layer is removed. Referring to FIGS. 7A/7B and FIGS. 8A/8B, in an embodiment of block 214, a photoresist layer is deposited over the devices 300, 302 and patterned (e.g., by exposing and developing the exposed photoresist) to form a patterned resist layer 802 that exposes the device 300, while the patterned resist layer 802 remains disposed over the device 302. In some embodiments, after formation of the patterned resist layer 802, the first dummy spacer layer 702 is removed from the device 300. By way of example, the first dummy spacer layer 702 is removed using a wet etch process, a dry etch process, or a combination thereof. After removal of the first dummy spacer layer 702 from the device 300, the patterned resist layer 802 (e.g., that remained over the device 302) may be removed, for example, by way of a solvent, resist stripper, ashing, or other suitable technique.

The method 200 then proceeds to block 216 where first source/drain features are formed. Referring to FIGS. 9A/9B, in an embodiment of block 216, first source/drain features 902 are formed in the P-type device 300. Thus, the source/drain features 902 may include P-type source/drain features. In some embodiments, the source/drain features 902 are formed in source/drain regions adjacent to and on either side of the gate stacks 316 of the device 300. For example, the source/drain features 902 may be formed within the trenches 330 of the device 300, over the exposed portions of the substrate 304 and in contact with the adjacent inner spacers 502 and the semiconductor channel layers (the epitaxial layers 310) of the device 300. In some embodiments, a clean process may be performed immediately prior to formation of the source/drain features 902. The clean process may include a wet etch, a dry etch, or a combination thereof. In addition, the clean process may remove any residual portions of the inner spacer material 502 that remained on top surfaces of the device 300 and/or on sidewalls or bottom surfaces of the trenches 330 (e.g., after the inner spacer etch-back process of block 210). In various examples, and during the formation of the first source/drain features 902, the N-type device 302 remains protected by the previously deposited first dummy spacer layer 702.

In some embodiments, the source/drain features 902 are formed by epitaxially growing a semiconductor material layer in the source/drain regions. In various embodiments, the semiconductor material layer grown to form the source/drain features 902 may include Ge, Si, GaAs, AlGaAs, SiGe, GaAsP, SiP, or other suitable material. The source/drain features 902 may be formed by one or more epitaxial (epi) processes. In some embodiments, the source/drain features 902 may be in-situ doped during the epi process. For example, in some embodiments, epitaxially grown SiGe source/drain features may be doped with boron. In some cases, epitaxially grown Si epi source/drain features may be doped with carbon to form Si:C source/drain features, phosphorous to form Si:P source/drain features, or both carbon and phosphorous to form SiCP source/drain features. In some embodiments, the source/drain features 902 are not in-situ doped, and instead an implantation process is performed to dope the source/drain features 902. In some embodiments, the source/drain features 902 may include P-type source/drain features, as noted above.

The method 200 then proceeds to block 218 where a remaining portion of the first dummy spacer layer is removed. Referring to FIGS. 9A/9B and FIGS. 10A/10B, in an embodiment of block 218, a remaining portion of the first dummy spacer layer 702, that previously remained over the N-type device 302, is removed from the N-type device 302. By way of example, the remaining portion of the first dummy spacer layer 702 is removed using a wet etch process, a dry etch process, or a combination thereof.

Figure 10B:
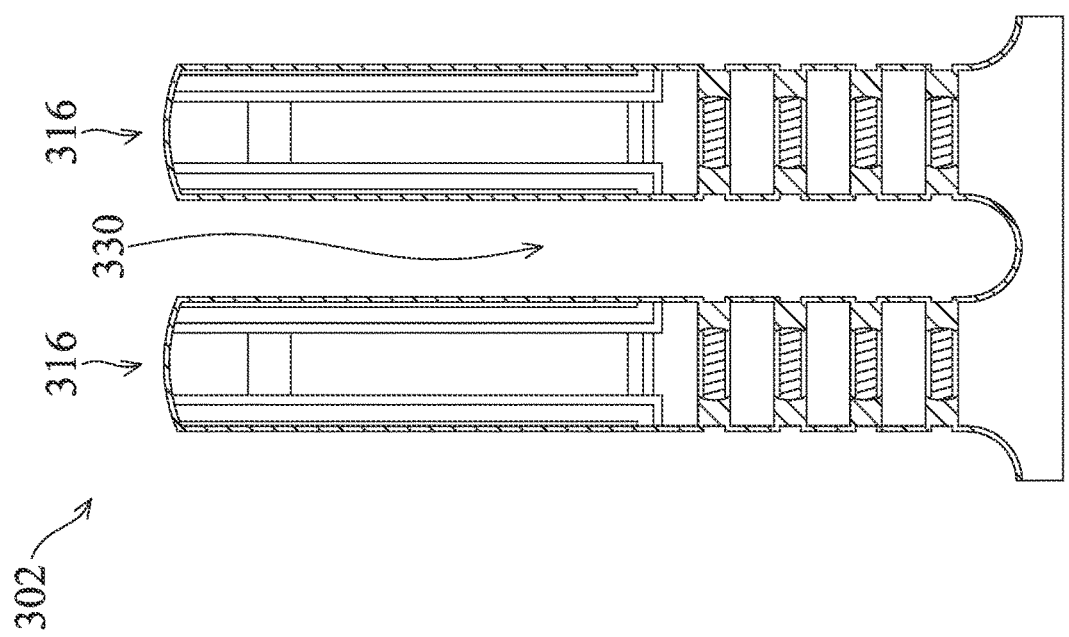
Figure 10A:
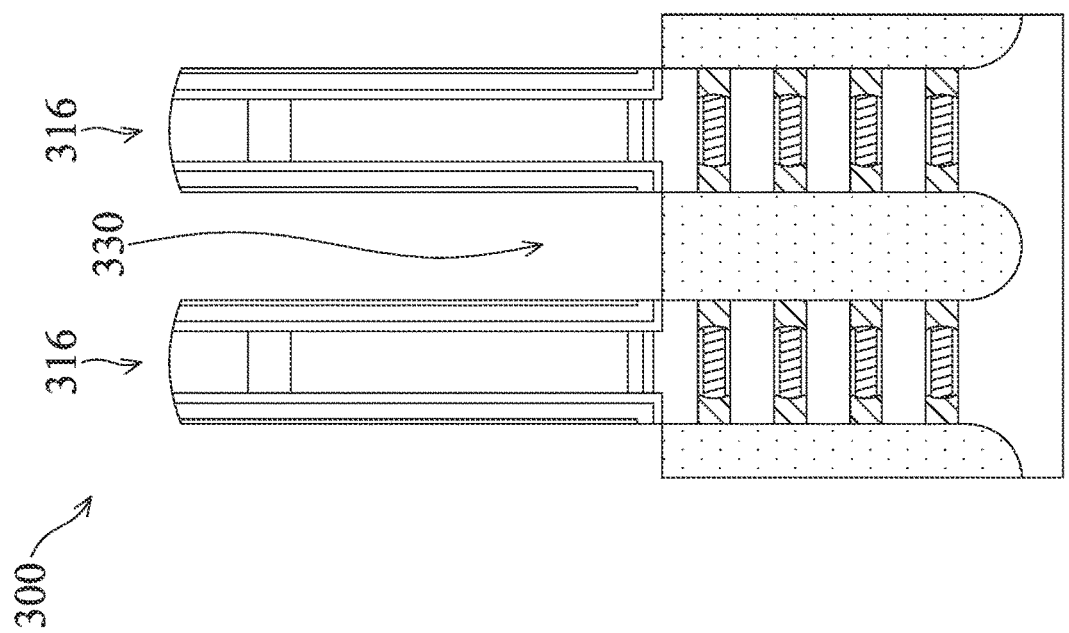

The method 200 then proceeds to block 220 where a second dummy spacer layer is deposited. Referring to FIGS. 10A/10B and FIGS. 11A/11B, in an embodiment of block 220, a second dummy spacer layer 1102 is deposited over the devices 300, 302 and within the trenches 330. In some examples, the second dummy spacer layer 1102 may include a dielectric material such as silicon oxide, silicon nitride, silicon carbide, silicon oxynitride, SiCN, silicon oxycarbide, SiOCN, a low-K material (e.g., with a dielectric constant 'k'<7), and/or combinations thereof. By way of example, the second dummy spacer layer 1102 may be formed by conformally depositing the second dummy spacer layer 1102 over the devices 300, 302 using processes such as a CVD process, an SACVD process, a flowable CVD process, an ALD process, a PVD process, or other suitable process. In some embodiments, the second dummy spacer layer 1102 may be deposited simultaneously over the devices 300, 302, or the second dummy spacer layer 1102 may be deposited first over one of the device 300 and the device 302, and then over the other of the device 300 and the device 302.

Figure 11B:
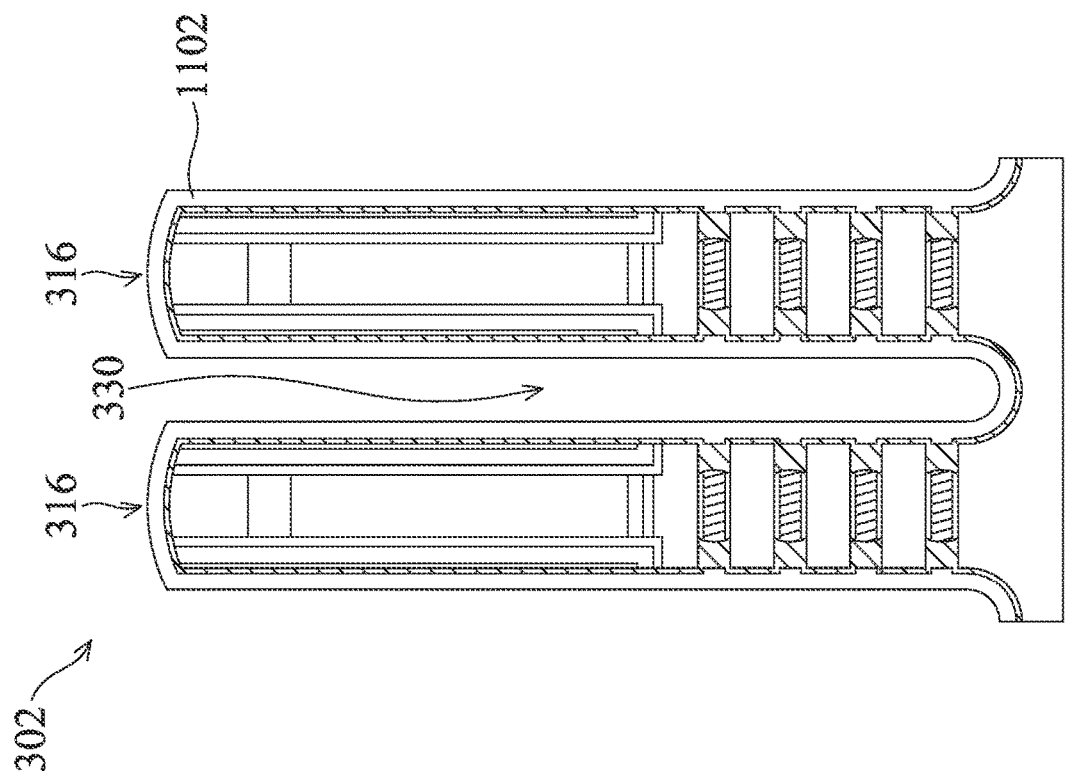
Figure 11A:
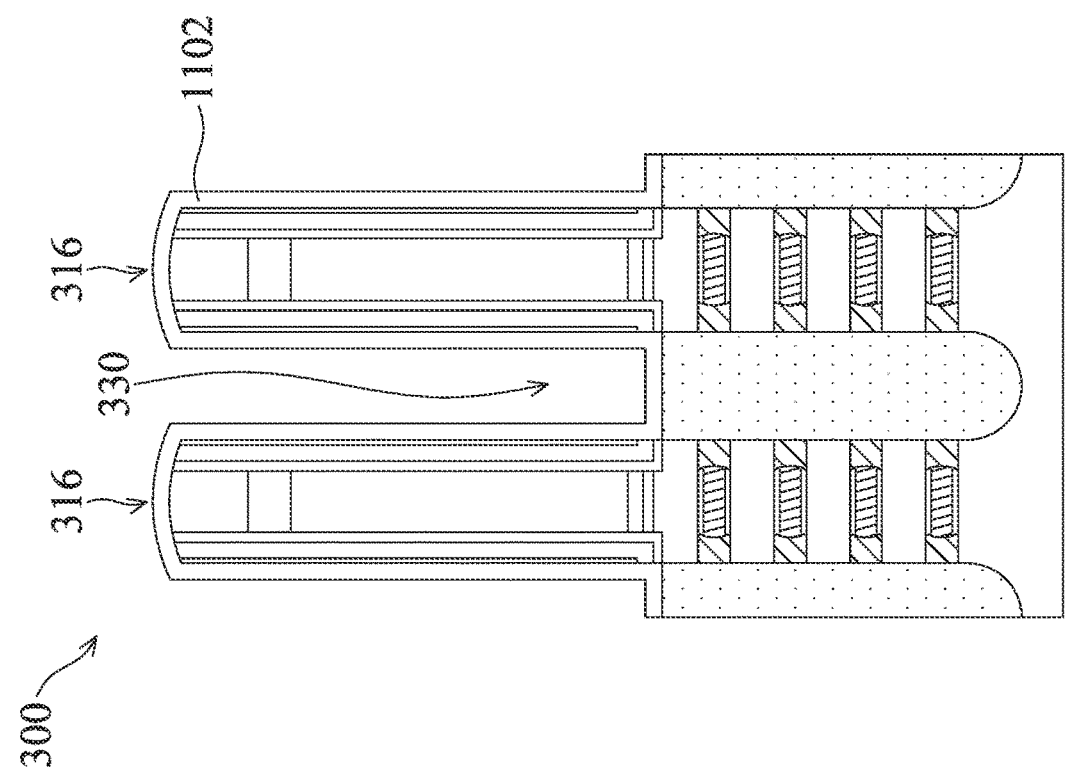
Figures 12A, 12B:
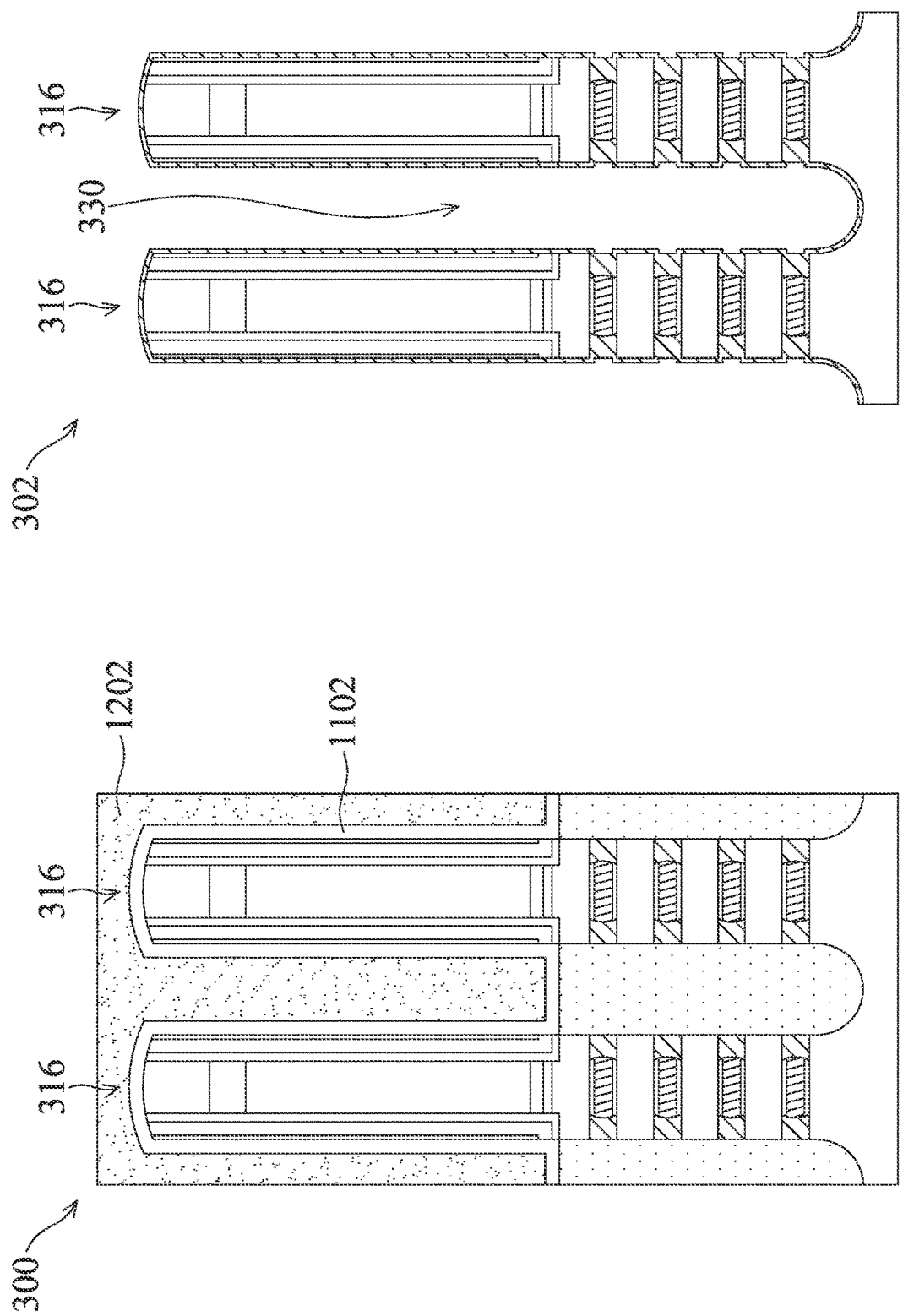

The method 200 then proceeds to block 222 where a first portion of the second dummy spacer layer is removed. Referring to FIGS. 11A/11B and FIGS. 12A/12B, in an embodiment of block 222, a photoresist layer is deposited over the devices 300, 302 and patterned (e.g., by exposing and developing the exposed photoresist) to form a patterned resist layer 1202 that exposes the device 302, while the patterned resist layer 1202 remains disposed over the device 300. In some embodiments, after formation of the patterned resist layer 1202, the second dummy spacer layer 1102 is removed from the device 302. By way of example, the second dummy spacer layer 1102 is removed using a wet etch process, a dry etch process, or a combination thereof. After removal of the second dummy spacer layer 1102 from the device 302, the patterned resist layer 1202 (e.g., that remained over the device 300) may be removed, for example, by way of a solvent, resist stripper, ashing, or other suitable technique.

Figure 13A:
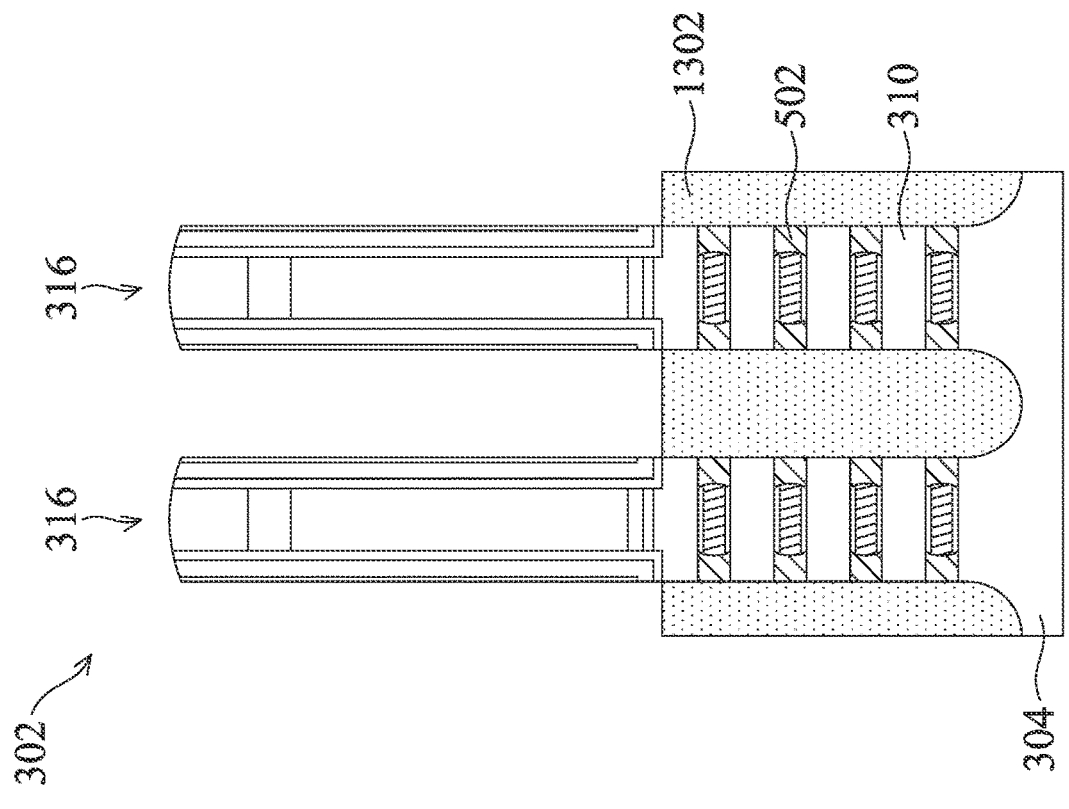
Figure 13B:
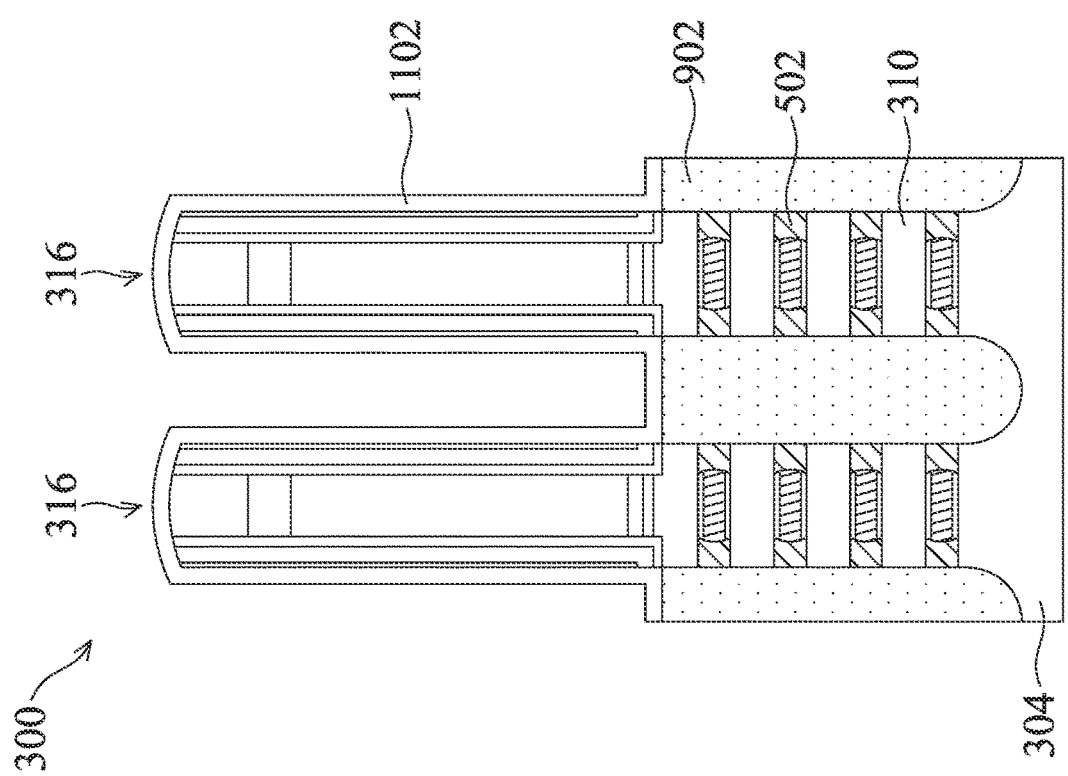

The method 200 then proceeds to block 224 where second source/drain features are formed. Referring to FIGS. 13A/13B, in an embodiment of block 224, second source/drain features 1302 are formed in the N-type device 302. Thus, the source/drain features 1302 may include N-type source/drain features. In some embodiments, the source/drain features 1302 are formed in source/drain regions adjacent to and on either side of the gate stacks 316 of the device 302. For example, the source/drain features 1302 may be formed within the trenches 330 of the device 302, over the exposed portions of the substrate 304 and in contact with the adjacent inner spacers 502 and the semiconductor channel layers (the epitaxial layers 310) of the device 302. In some embodiments, a clean process (e.g., wet etch, dry etch, or combination thereof) may be performed immediately prior to formation of the source/drain features 1302. The clean process may remove any residual portions of the inner spacer material 502 that remained on top surfaces of the device 302 and/or on sidewalls or bottom surfaces of the trenches 330 (e.g., after the inner spacer etch-back process of block 210). In various examples, and during the formation of the second source/drain features 1302, the P-type device 300 remains protected by the previously deposited second dummy spacer layer 1102.

In some embodiments, the source/drain features 1302 are formed by epitaxially growing a semiconductor material layer in the source/drain regions. In various embodiments, the semiconductor material layer grown to form the source/drain features 1302 may include Ge, Si, GaAs, AlGaAs, SiGe, GaAsP, SiP, or other suitable material. The source/drain features 1302 may be formed by one or more epitaxial (epi) processes. In some embodiments, the source/drain features 1302 may be in-situ doped during the epi process. For example, in some embodiments, epitaxially grown SiGe source/drain features may be doped with boron. In some cases, epitaxially grown Si epi source/drain features may be doped with carbon to form Si:C source/drain features, phosphorous to form Si:P source/drain features, or both carbon and phosphorous to form SiCP source/drain features. In some embodiments, the source/drain features 1302 are not in-situ doped, and instead an implantation process is performed to dope the source/drain features 1302.

Figure 14A:
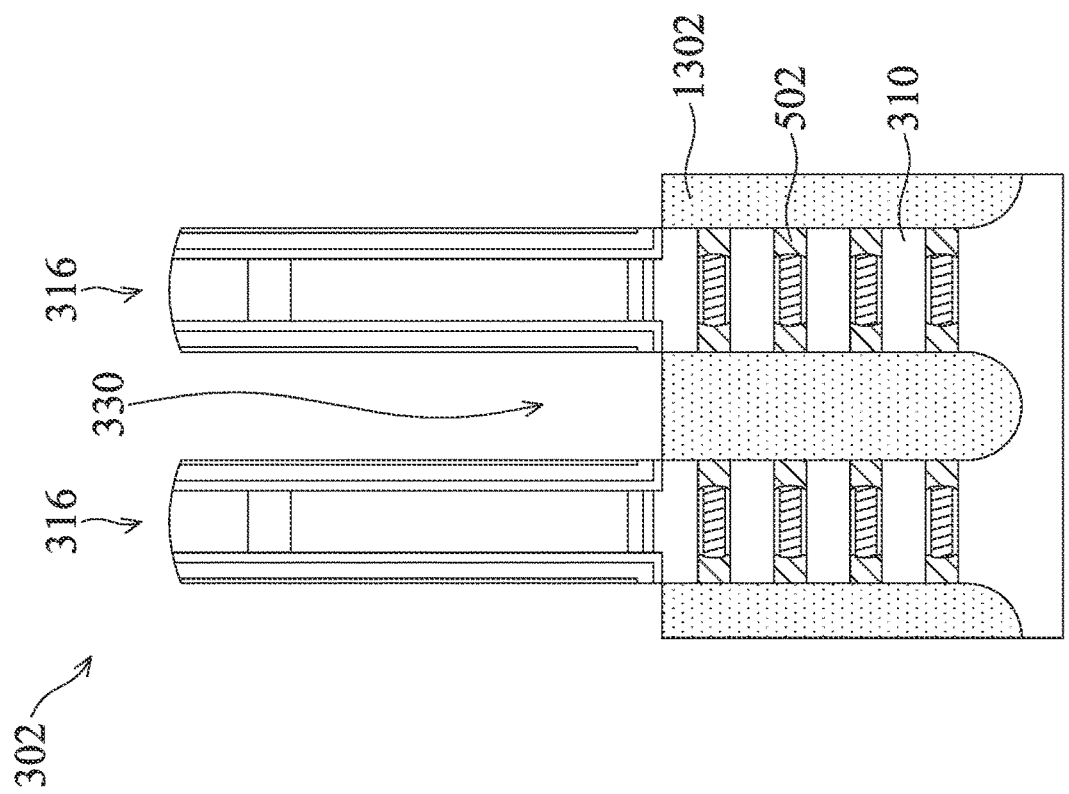
Figure 14B:
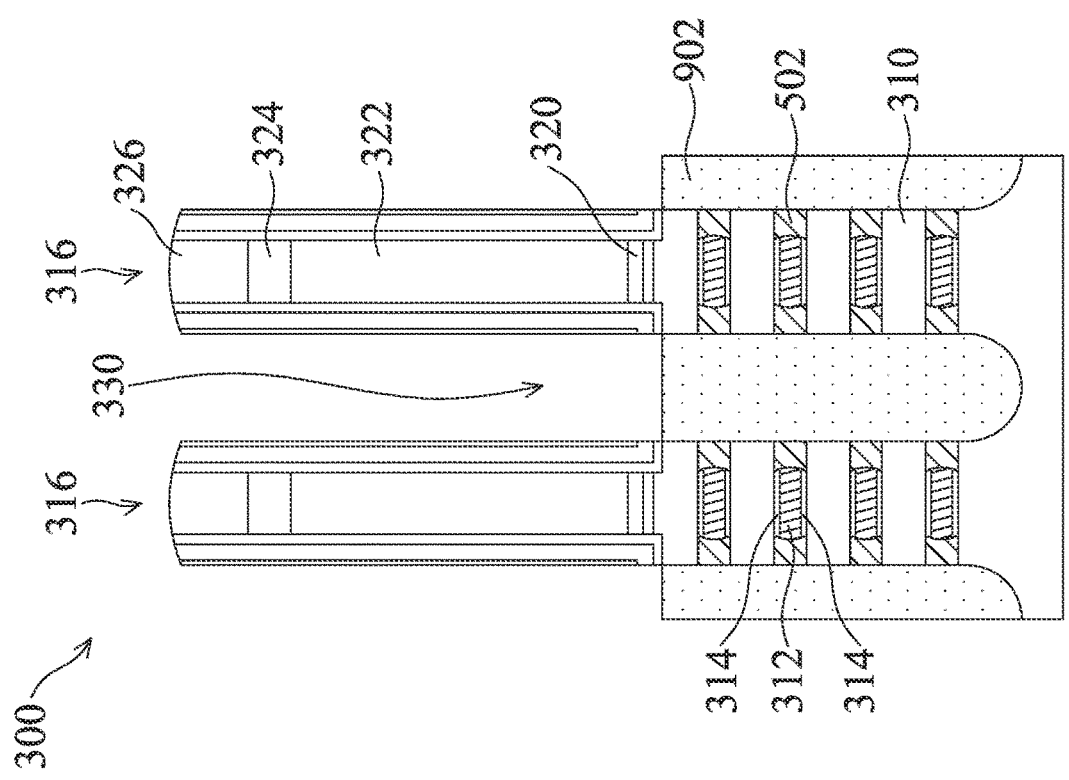

The method 200 then proceeds to block 226 where a remaining portion of the second dummy spacer layer is removed. Referring to FIGS. 13A/13B and FIGS. 14A/14B, in an embodiment of block 226, a remaining portion of the second dummy spacer layer 1102, that previously remained over the P-type device 300, is removed from the P-type device 300. By way of example, the remaining portion of the second dummy spacer layer 1102 is removed using a wet etch process, a dry etch process, or a combination thereof.

After removal of the remaining portion of the second dummy spacer layer 1102 (block 226), the method 200 then proceeds to block 228 where an inter-layer dielectric (ILD) layer is formed and a chemical mechanical polishing (CMP) process is performed. For clarity of discussion, it is noted that the remaining portion of the method 200 (e.g., blocks 228, 230, 232, 234) is described with reference to the P-type device 300. However, it will be understood that aspects described with reference to the remaining portion of the method 200 (e.g., blocks 228, 230, 232, 234) may equally apply to the N-type device 302, discussed above. Referring now to the example of FIGS. 14A and 15, in an embodiment of block 228 an ILD layer 1502 is formed over the devices 300, 302. In some embodiments, a contact etch stop layer (CESL) 1504 is formed over the devices 300, 302 prior to forming the ILD layer 1502. In some examples, the CESL 1504 includes a silicon nitride layer, silicon oxide layer, a silicon oxynitride layer, and/or other materials known in the art. The CESL 1504 may be formed by plasma-enhanced chemical vapor deposition (PECVD) process and/or other suitable deposition or oxidation processes. In some embodiments, the ILD layer 1502 includes materials such as tetra-ethylorthosilicate (TEOS) oxide, un-doped silicate glass, or doped silicon oxide such as borophosphosilicate glass (BPSG), fluorosilicate glass (FSG), phosphosilicate glass (PSG), boron doped silicon glass (BSG), and/or other suitable dielectric materials. The ILD layer 1502 may be deposited by a PECVD process or other suitable deposition technique. In some embodiments, after formation of the ILD layer 1502, the devices 300, 302 may be subject to a high thermal budget process to anneal the ILD layer 1502.

In a further embodiment of block 228, and after depositing the ILD layer 1502 (and/or the CESL 1504 or other dielectric layers), a planarization process may be performed to expose a top surface of the gate stacks 316. For example, the planarization process may include a CMP process which removes portions of the ILD layer 1502 (and CESL 1504, if present) overlying the gate stacks 316 and planarizes a top surface of the devices 300, 302. In addition, the CMP process may remove the hard mask layers 324, 326 overlying the gate stacks 316 to expose the underlying electrode layer 322, such as a polysilicon electrode layer, of the dummy gate.

Thereafter, the method 200 proceeds to block 230 where dummy gates are removed, and a channel layer release process is performed. Referring to the example of FIGS. 15 and 16, in an embodiment of block 230, the exposed electrode layer 322 of the gate stacks 316 may initially be removed by suitable etching processes, followed by an etching process to remove the dielectric layer 320, and the optional sacrificial layer 319 (if included), from the gate stacks 316. In some embodiments, the etching processes may include a wet etch, a dry etch, or a combination thereof.

After removal of the dummy gates, and in a further embodiment of block 230, the SiGe layers (e.g., the layers 312, 314) in the channel region of the devices 300, 302 may be selectively removed (e.g., using a selective etching process), while the Si semiconductor channel layers 310 remain unetched. In some examples, selective removal of the SiGe layers may be referred to as a channel layer release process (e.g., as the semiconductor channel layers 310 are released from the SiGe layers). The selective etching process may be performed through a trench provided by the removal of the dummy gate electrode. In some embodiments, the selective etching process may include a selective wet etching process. In some cases, the selective wet etching includes ammonia and/or ozone. As merely one example, the selective wet etching process includes tetra-methyl ammonium hydroxide (TMAH). It is noted that as a result of the selective removal of the epitaxial layers 312, 314, gaps 1602 may be formed between the adjacent nanowires in the channel region (e.g., between adjacent epitaxial layers 310). By way of example, the gaps 1602 may serve to expose first portions of the epitaxial layers 310 between opposing inner spacers 502, while second portions of the epitaxial layers 310 remain covered by the inner spacers 502. It is also noted that formation of the gaps 1602 exposes concave surfaces 1604 of the inner spacers 502. As described in more detail below, portions of gate structures for each of the devices 300, 302 will be formed within the gaps 1602.

After selective removal of the SiGe layers, the method 200 proceeds to block 232 where a gate structure is formed. The gate structure may include a high-K/metal gate stack, however other compositions are possible. In some embodiments, the gate structure may form the gate associated with the multi-channels provided by the plurality of exposed semiconductor channel layers (the exposed epitaxial layers 310, now having gaps 1602 therebetween) in the channel region of the devices 300, 302. With reference to the example of FIGS. 16 and 17, in an embodiment of block 232, an interfacial layer (IL) 1702 is formed on exposed surfaces of the epitaxial layers 310, including on the exposed first portions of the epitaxial layers 310 within the gaps 1602 and between opposing inner spacers 502. In various embodiments, the IL 1702 is formed by a thermal oxidation process. In some cases, the thermal oxidation process may include a wet thermal oxidation process or a dry thermal oxidation process. By way of example, the thermal oxidation process includes exposure of the devices 300, 302 to an oxygen-containing gas at a temperature in a range between about 900-1,000 degrees Celsius. In some embodiments, the IL 1702 may include a dielectric material such as silicon oxide ($SiO_2$), HfSiO, or silicon oxynitride (SiON). It is noted that formation of the IL 1702 by a thermal oxidation process results in consumption of at least some of the Si at the surface of the epitaxial layers 310. As a result, the IL 1702 may be at least partially embedded along the exposed surface of the epitaxial layers 310. It is also noted that the IL 1702 does not extend across the entirety of the surface of the epitaxial layers 310 (between adjacent source/drain features 902, 1302) since the thermal oxidation process forms the IL 1702 on the exposed portions of the epitaxial layers 310 (between opposing inner spacers 502), while second portions of the epitaxial layers 310 that are covered by the inner spacers 502 remain protected from the thermal oxidation process.

Figure 17:
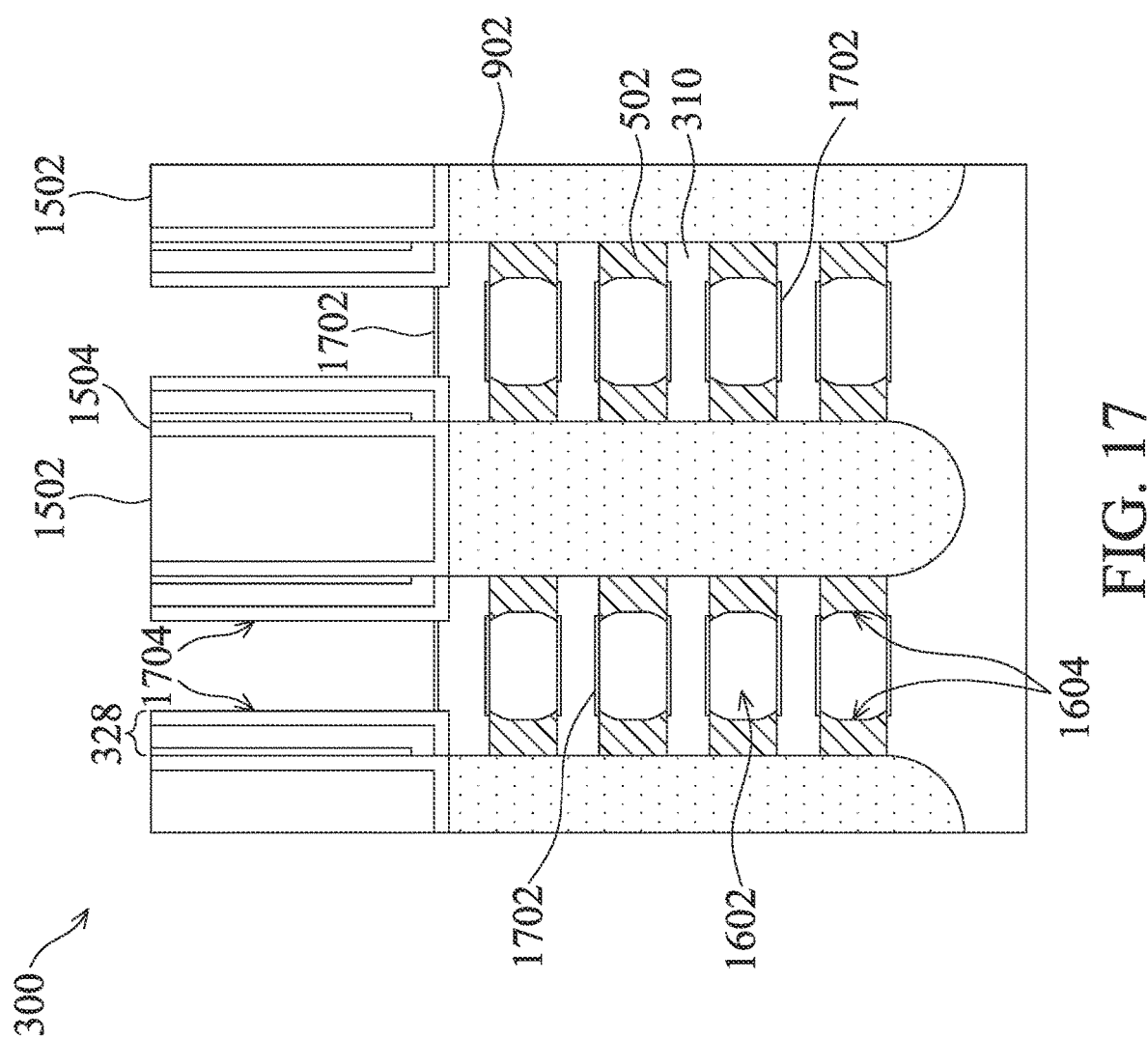
Figure 18:
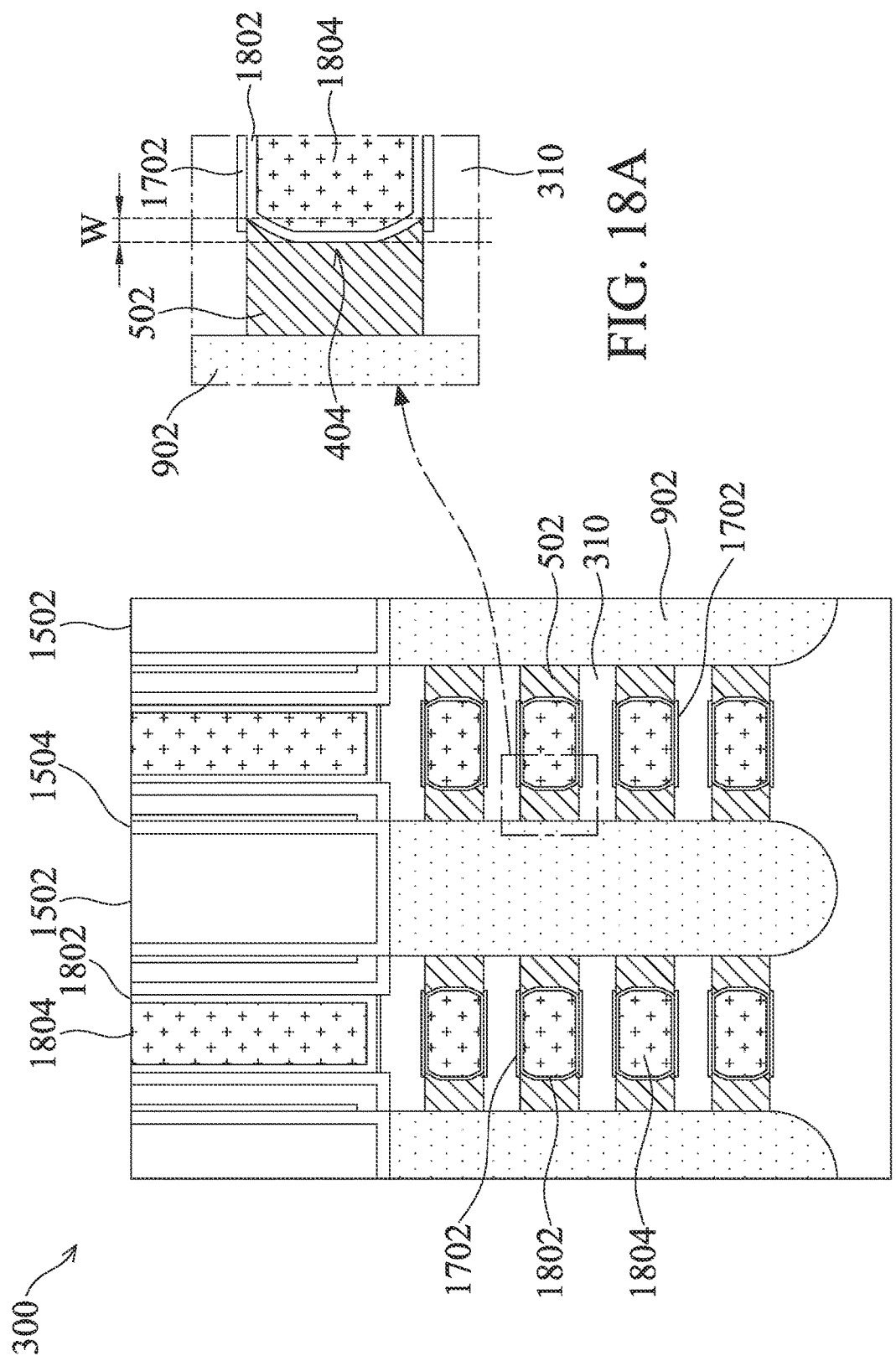

In a further embodiment of block 232, and with reference to the example of FIGS. 17 and 18, a high-K dielectric layer 1802 is formed over the IL 1702. In some examples, the high-K dielectric layer 1802 may also be formed on sidewalls 1704 of the one or more spacer layers 328, and on the exposed concave surfaces 1604 of the inner spacers 502. In various embodiments, the IL 1702 and the high-K dielectric layer 1802 may collectively define a gate dielectric of the gate structure for each of the devices 300, 302. In some embodiments, the gate dielectric has a total thickness of about 1-5 nm. High-K gate dielectrics, as used and described herein, include dielectric materials having a high dielectric constant, for example, greater than that of thermal silicon oxide (~3.9).

In some embodiments, the high-K dielectric layer 1802 may include a high-K dielectric layer such as hafnium oxide ($HfO_2$). Alternatively, the high-K dielectric layer 1802 may include other high-K dielectrics, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material. In various embodiments, the high-K dielectric layer 1802 may be formed by ALD, physical vapor deposition (PVD), pulsed laser deposition (PLD), CVD, and/or other suitable methods.

Still referring to the example of FIG. 18, and in a further embodiment of block 232, a metal gate including a metal layer 1804 is formed over the gate dielectric (e.g. over the IL 1702 and the high-K dielectric layer 1802). The metal layer 1804 may include a metal, metal alloy, or metal silicide. Additionally, the formation of the gate dielectric/metal gate stack may include depositions to form various gate materials, one or more liner layers, and one or more CMP processes to remove excessive gate materials and thereby planarize a top surface of the devices 300, 302.

In some embodiments, the metal layer 1804 may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the metal layer 1804 may include Ti, Ag, Al, TiAlN, TaC, TaCN, TaSiN, Mn, Zr, TiN, TaN, Ru, Mo, Al, WN, Cu, W, Re, Ir, Co, Ni, other suitable metal materials or a combination thereof. In various embodiments, the metal layer 1804 may be formed by ALD, PVD, CVD, e-beam evaporation, or other suitable process. Further, the metal layer 1804 may be formed separately for N-type and P-type transistors (e.g., for the devices 300, 302) which may use different metal layers. In addition, the metal layer 1804 may provide an N-type or P-type work function, may serve as a transistor (e.g., GAA transistor) gate electrode, and in at least some embodiments, the metal layer 1804 may include a polysilicon layer. With respect to the devices shown and discussed, the gate structure includes portions that interpose each of the epitaxial layers 310, which each provide semiconductor channel layers for the GAA transistors.

Regarding formation of the gate structure (block 232), and with reference to the example of FIGS. 18 and 18A (which shows an enlarged view of a portion of the device 300, as indicated by the dashed oval), it is noted that portions of the gate structure are formed within the regions previously occupied by the SiGe layers 312, 314 (e.g., formed within the gaps 1602). Thus, portions of the gate structure that replace the layers 312, 314 (replacement gate structures) now define the convex profile 404 previously defined by the combination of the recessed SiGe layers 312, 314 (FIG. 4C). As noted above, the convex profile 404 spans a width 'W' of between about 0-3 nm. FIG. 18 also shows that the gate structure interfaces (is in contact with) the inner spacers 502 along opposing lateral surfaces of the gate structure. It is further noted that while the gate structure now defines the convex profile 404, the inner spacers 502 interfacing the gate structure define a complementary concave profile (e.g., defined by concave surfaces 1604). Thus, the gate structures interfacing the inner spacers 502 avoid the reliability issues associated with the pointed end tip portions of metal gate structures of at least some existing implementations, while also providing for improved high-K dielectric layer 1802 deposition at the inner spacer/metal gate layer interface.

Figure 19:
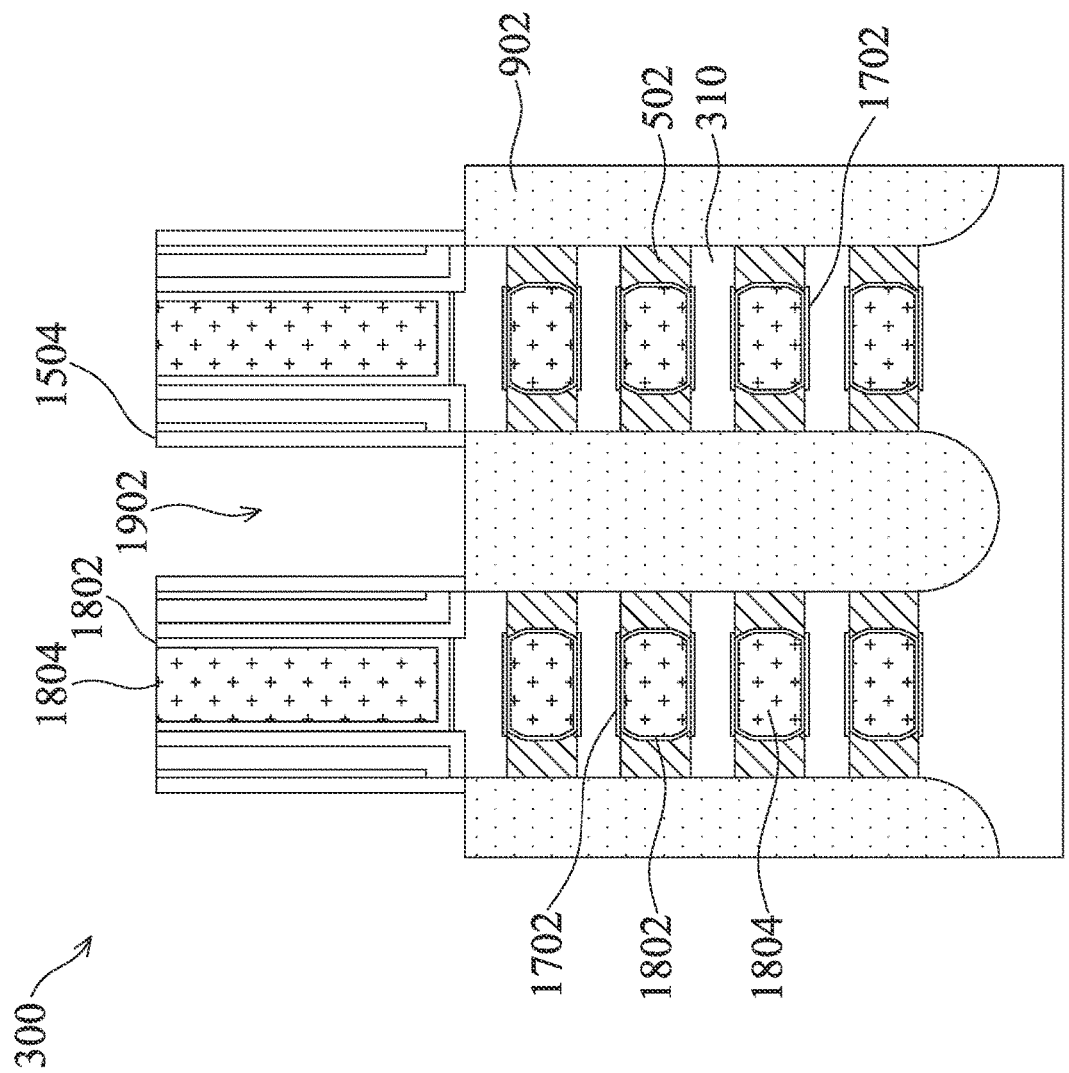

After formation of the gate structure, the method 200 proceeds to block 234 where contact features are formed. Referring to the example of FIGS. 18 and 19, in an embodiment of block 234, an etching process may initially be performed to remove the ILD layer 1502 and the CESL 1504 in regions over the source/drain features 902, 1302 to form contact openings 1902 that expose the source/drain features 902, 1302. In some embodiments, the etching process may include a dry etching process, where portions of the CESL 1504 remain on sidewalls of the contact openings 1902. With reference to the example of FIGS. 19 and 20, in a further embodiment of block 234, source/drain contact features may be formed within the contact openings 1902. For example, a silicide layer 2002 and a contact metal 2004, formed over the silicide layer 2002, may be formed to provide a low-resistance contact to the source/drain features 902, 1302 of the devices 300, 302, respectively. By way of example, the silicide layer 2002 may include TiSi, NiSi, TiN, and/or other suitable material. In some embodiments, the contact metal 2004 may include tungsten, cobalt, or other appropriate metal layer.

Generally, the semiconductor devices 300, 302 may undergo further processing to form various features and regions known in the art. For example, further processing may form various contacts/vias/lines and multilayer interconnect features (e.g., metal layers and interlayer dielectrics) on the substrate 304, configured to connect the various features to form a functional circuit that may include one or more multi-gate devices (e.g., one or more GAA transistors). In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. Moreover, additional process steps may be implemented before, during, and after the method 200, and some process steps described above may be modified, replaced, or eliminated in accordance with various embodiments of the method 200.

For example, in the method 200 the sidewall profile of the trenches 330 (formed by the source/drain etch process of block 204) is illustrated as being a substantially vertical sidewall profile, as shown in FIG. 3A. However, in some alternative embodiments, the trenches 330 may instead be formed with a tapered sidewall profile. This is shown in the example of FIG. 21, where the source/drain etch recess process (of block 204) may be used to form the trenches 330 with a tapered profile 2102. As a result of forming the trenches 330 with the tapered profile 2102, a subsequently formed device (e.g., as shown in FIG. 22 after formation of contact features (block 234)) may likewise have a tapered profile 2202 corresponding to the tapered profile 2102. Consider that a transistor effective gate length 'Leff' may be defined as the length of a region where an epitaxial layer 310 and an adjacent portion of the gate structure interface one another. As such, the gate length of the devices 300, 302 may thus be determined, at least in part, by the sidewall profile of the trenches 330 (formed by the source/drain etch process of block 204) as well as by the SiGe recess process (of block 206). Thus, as shown in the device of FIG. 22 having the tapered profile 2202, a gate length 'Leff' near the bottom of the tapered profile 2202 will be larger than gate lengths disposed higher up along the tapered profile 2202.

Figure 20:
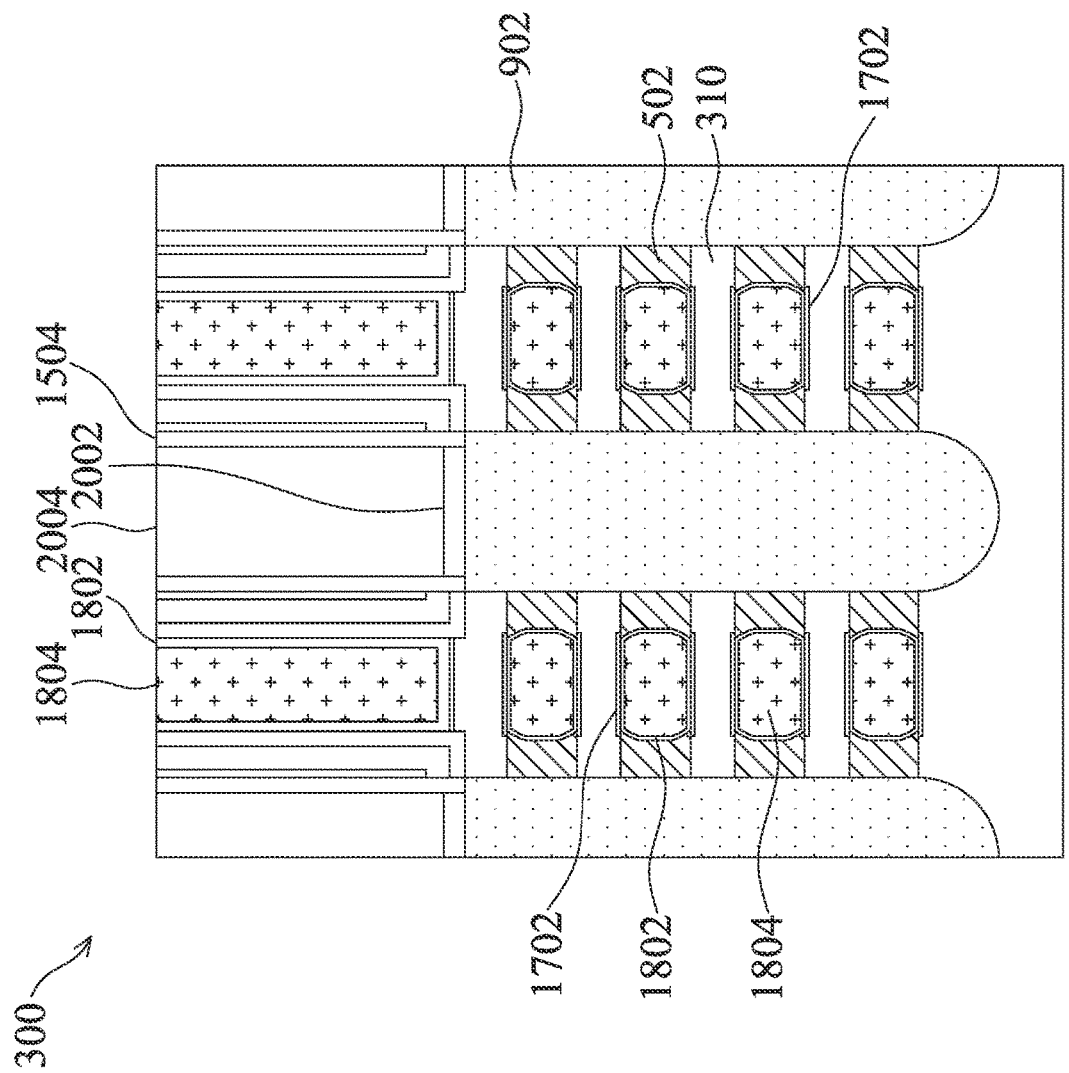

As another example, in the method 200, the lateral surfaces of the inner spacers 502 (e.g., the surfaces interfacing the source/drain features 902 and/or 1302) are illustrated as being substantially aligned with lateral surfaces of the epitaxial layers 310 disposed above and/or beneath the inner spacers 502, for example as shown in FIG. 20. However, in some alternative embodiments and during the inner spacer etch-back process of block 210, the inner spacer etch-back process may be used to over etch the inner spacer material 502 such that the lateral surfaces of the inner spacers 502 (e.g., the surfaces interfacing the source/drain features 902 and/or 1302) are recessed by a distance 'R' with respect to the lateral surfaces of the epitaxial layers 310 disposed above and/or beneath the inner spacers 502, for example as shown in FIG. 23 (or more closely in the enlarged view of FIG. 23A). As a result of over etching the inner spacers 502, a subsequently formed source/drain region (e.g., such as the source/drain features 902 and/or 1302) may extend into the recessed region to form a source/drain region having a T-shaped feature (e.g., as shown in FIG. 23A). Thus, in such a case, a portion of the source/drain region is disposed above and/or below lateral ends of adjacent epitaxial layers 310.

Figures 24, 24A:
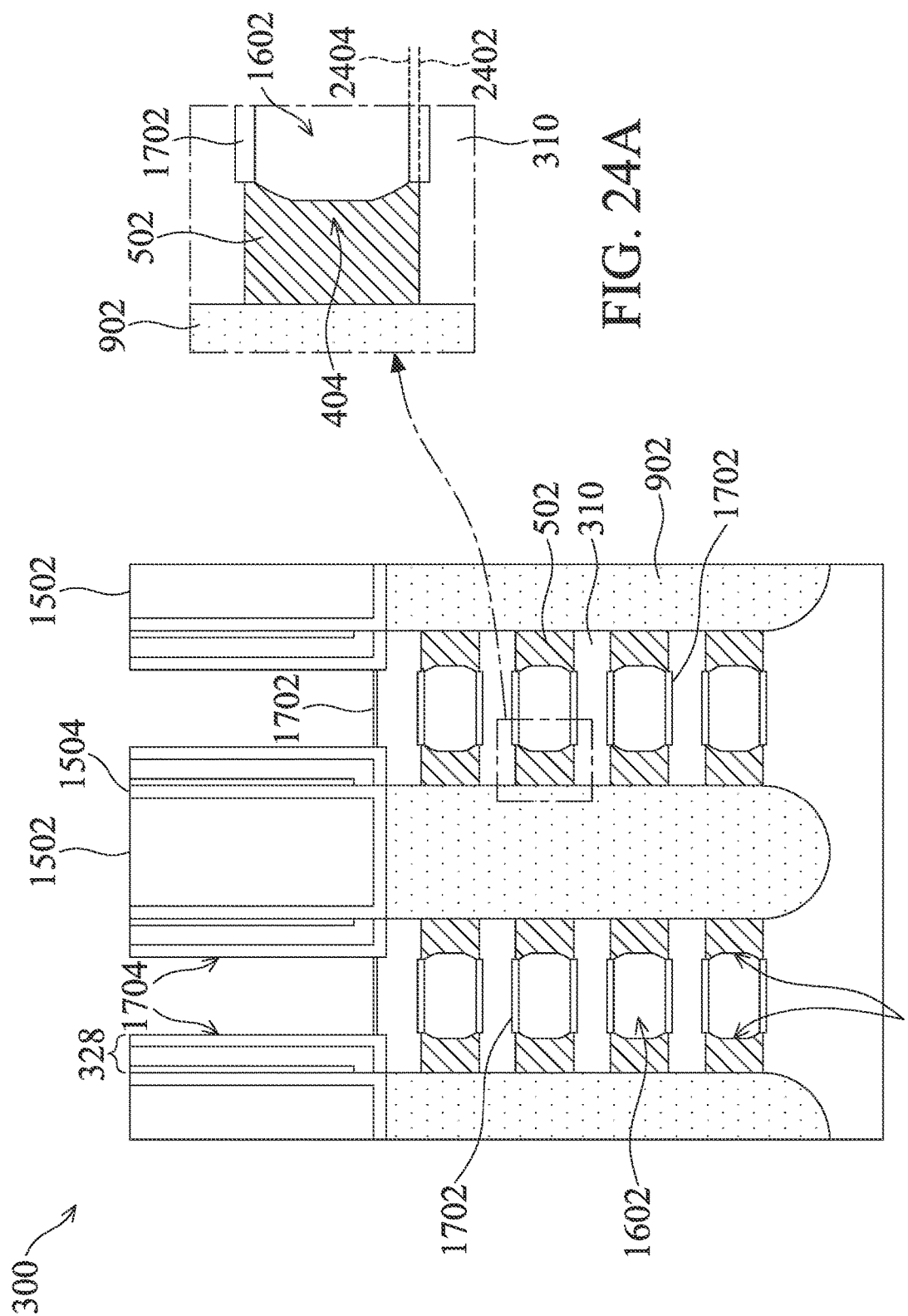
FIG. 24 illustrates a semiconductor device including an interfacial layer extending beyond a surface of the epitaxial layer on which it is formed, in accordance with some embodiments.
FIG. 24A provides a zoomed-in view of a portion of the semiconductor device shown in FIG. 24, in accordance with some embodiments.

As yet another example, in the method 200, the interfacial layer (IL) 1702 as illustrated in FIG. 17 appears to be embedded along the exposed surface of the epitaxial layers 310 largely without extending beyond a surface of the epitaxial layers 310. However, in some embodiments, formation of the IL 1702 by the thermal oxidation process (at block 232) may result in the IL 1702 being both partially embedded within the epitaxial layers 310 and partially extending beyond the surface of the epitaxial layers 310, illustrated in FIG. 24. To better illustrate this feature, FIG. 24A provides an enlarged view of a portion of FIG. 24. The enlarged view of FIG. 24A shows a plane 2402 that is substantially parallel with the surface of the epitaxial layers 310 and a plane 2404 that is substantially parallel with a surface of the IL 1702 that extends beyond the surface of the epitaxial layers 310 and into the gaps 1602. It will be understood that the embodiments shown in FIGS. 24 and 24A, with the relative position of the IL 1702 extending beyond the surface of the epitaxial layers 310, may also apply to FIGS. 17-23, which may not be drawn to scale.

With respect to the description provided herein, disclosed are methods and structures for providing multi-gate devices (e.g., such as a GAA transistors) having an optimized inner spacer/metal gate layer interfacial profile. For example, in some embodiments a metal gate structure (or portion thereof) interfacing an adjacent inner spacer has a convex sidewall profile, thereby improving device reliability and providing for improved high-K dielectric deposition at the inner spacer/metal gate structure interface. As described above, and in at least some embodiments, the convex sidewall profile may be initially formed during a SiGe recess process of a SiGe layer, where the SiGe layer includes a multilayer epitaxial layer with high/low Ge concentrations and where the SiGe etch rate is dependent on Ge concentration. Those of skill in the art will readily appreciate that the methods and structures described herein may be applied to a variety of other semiconductor devices to advantageously achieve similar benefits from such other devices without departing from the scope of the present disclosure.

Thus, one of the embodiments of the present disclosure described a method that includes providing a fin having a plurality of semiconductor channel layers and a plurality of multilayer epitaxial layers that interpose the plurality of semiconductor channel layers. Each of the plurality of multilayer epitaxial layers includes a first epitaxial layer interposed between a second epitaxial layer and a third epitaxial layer. The first epitaxial layer has a first etch rate and the second and third epitaxial layers have a second etch rate greater than the first etch rate. In some embodiments, the method further includes laterally etching the first, second, and third epitaxial layers to provide a convex sidewall profile on opposing lateral surfaces of the multilayer epitaxial layers. Thereafter, the method includes forming an inner spacer between adjacent layers of the plurality of semiconductor channel layers. The inner spacer interfaces the convex sidewall profile of the multilayer epitaxial layers along a first inner spacer sidewall surface. The method further includes replacing each of the multilayer epitaxial layers with a portion of a gate structure. The portion of the gate structure provides the convex sidewall profile previously provided by the laterally etched multilayer epitaxial layers.

In another of the embodiments, discussed is a method that includes providing a first fin in a first device type region and a second fin in a second device type region. The first fin and the second fin each include a plurality of channel layers and a plurality of epitaxial layer stacks between the plurality of channel layers. Each of the plurality of epitaxial layer stacks includes a first SiGe layer with a first concentration of Ge interposed between second and third SiGe layers with a second concentration of Ge greater than the first concentration of Ge. In various embodiments, the method further includes performing a SiGe recess process to laterally etch the first, second, and third SiGe layers and form an opening between adjacent channel layers of the plurality of channel layers, where the etched first, second, and third SiGe layers collectively define a convex sidewall profile. The method further includes forming an inner spacer within the opening between adjacent channel layers of the plurality of channel layers. The inner spacer interfaces the convex sidewall profile along a first inner spacer sidewall surface, and the first inner spacer sidewall surface defines a complementary concave profile.

In yet another of the embodiments, discussed is a semiconductor device including a fin extending from a substrate, where the fin includes a plurality of semiconductor channel layers. In some embodiments, the semiconductor device further includes a portion of a gate structure disposed between adjacent semiconductor channel layers of the plurality of semiconductor channel layers, where opposing sidewall surfaces of the portion of the gate structure define a convex profile. The semiconductor device further includes inner spacers disposed between adjacent semiconductor channel layers of the plurality of semiconductor channel layers and on either side of the portion of the gate structure. The inner spacers interface the convex profile along first surfaces of the inner spacers, and the first surfaces of the inner spacers define a concave profile in contact with the convex profile.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor device, comprising:
   providing a fin including a plurality of semiconductor channel layers and a plurality of multilayer epitaxial layers that interpose the plurality of semiconductor channel layers, wherein each of the plurality of multilayer epitaxial layers includes a first epitaxial layer interposed between a second epitaxial layer and a third epitaxial layer, and wherein the first epitaxial layer has a first etch rate and the second and third epitaxial layers have a second etch rate greater than the first etch rate;
   laterally etching the first, second, and third epitaxial layers to provide a convex sidewall profile on opposing lateral surfaces of the multilayer epitaxial layers;
   forming an inner spacer between adjacent layers of the plurality of semiconductor channel layers, wherein the inner spacer interfaces the convex sidewall profile of the multilayer epitaxial layers along a first inner spacer sidewall surface, wherein the inner spacer has a second inner spacer sidewall surface opposite the first spacer sidewall surface and facing a source/drain region, wherein an entirety of the second inner spacer sidewall surface, extending from a bottom surface of a first adjacent layer of the plurality of the semiconductor channel layers disposed above the inner spacer to a top surface of a second adjacent layer of the plurality of the semiconductor channel layers disposed beneath the inner spacer, defines a first plane, wherein the first and second adjacent layers of the plurality of semiconductor channel layers include lateral sidewall surfaces that collectively define a second plane parallel to the first plane and spaced a distance from the first plane; and
   replacing each of the multilayer epitaxial layers with a portion of a gate structure, wherein the portion of the gate structure provides the convex sidewall profile previously provided by the laterally etched multilayer epitaxial layers.

2. The method of claim 1, wherein each of the plurality of semiconductor channel layers includes silicon (Si).

3. The method of claim 1, wherein the first, second, and third epitaxial layers include silicon germanium (SiGe).

4. The method of claim 3, wherein the first epitaxial layer has a first concentration of Ge, and wherein the second and third epitaxial layers have a second concentration of Ge greater than the first concentration of Ge.

5. The method of claim 4, wherein the first concentration of Ge is in a range between about 15-35%, and wherein the second concentration of Ge is in a range between about 25-40%.

6. The method of claim 1, wherein the laterally etching the first, second, and third epitaxial layers is performed using at least one of a standard clean 1 (SC-1) solution, ozone ($O_3$), a solution of ammonium hydroxide ($NH_4OH$), hydrogen peroxide ($H_2O_2$) and water ($H_2O$), hydrofluoric acid (HF), buffered HF, and a fluorine-based etch.

7. The method of claim 1, wherein the fin further includes a dummy gate stack disposed over a channel region of the fin, and wherein the method further comprises:
   prior to the laterally etching, performing a source/drain etch process to form a trench in the source/drain region adjacent to the dummy gate stack and to expose lateral surfaces of the plurality of semiconductor channel layers and the plurality of multilayer epitaxial layers; and
   laterally etching the exposed lateral surfaces of the plurality of multilayer epitaxial layers to provide the convex sidewall profile on the opposing lateral surfaces of the multilayer epitaxial layers.

8. The method of claim 7, wherein the forming the inner spacer further includes depositing an inner spacer material within the trench and within recesses formed by the laterally etching the first, second, and third epitaxial layers, and performing an inner spacer etch-back process to provide the inner spacer.

9. The method of claim 7, further comprising:
   prior to replacing each of the multilayer epitaxial layers with the portion of the gate structure, epitaxially growing a source/drain feature in the trench, wherein the source/drain feature interfaces the inner spacer along the second inner spacer sidewall surface, and wherein the source/drain feature interfaces end portions of the plurality of semiconductor channel layers.

10. The method of claim 1, further comprising:
prior to replacing each of the multilayer epitaxial layers with the portion of the gate structure, epitaxially growing a source/drain feature having a T-shaped feature that contacts the inner spacer along the second inner spacer sidewall surface, wherein the T-shaped feature interfaces end portions of the plurality of semiconductor channel layers.

11. A method of fabricating a semiconductor device, comprising:
providing a first fin in a first device type region and a second fin in a second device type region, wherein the first fin and the second fin each include a plurality of channel layers and a plurality of epitaxial layer stacks between the plurality of channel layers, wherein each of the plurality of epitaxial layer stacks includes a first SiGe layer with a first concentration of Ge interposed between second and third SiGe layers with a second concentration of Ge greater than the first concentration of Ge;
after providing the first fin and the second fin, performing a source/drain etch process to form a trench in a source/drain region;
after performing the source/drain etch process, performing a SiGe recess process to laterally etch the first, second, and third SiGe layers and form an opening between adjacent channel layers of the plurality of channel layers, wherein the etched first, second, and third SiGe layers collectively define a convex sidewall profile;
forming an inner spacer within the opening between adjacent channel layers of the plurality of channel layers, wherein the inner spacer interfaces the convex sidewall profile along a first inner spacer sidewall surface, wherein the first inner spacer sidewall surface defines a complementary concave profile, wherein the inner spacer has a second inner spacer sidewall surface opposite the first inner spacer sidewall surface, wherein the second inner spacer sidewall surface defines a first plane, wherein the adjacent channel layers disposed above and beneath the inner spacer include lateral sidewall surfaces that collectively define a second plane parallel to the first plane, and wherein the first plane is spaced a distance from the second plane; and
after forming the inner spacer, epitaxially growing a source/drain feature in the trench, wherein the source/drain feature contacts the inner spacer along the second inner spacer sidewall surface.

12. The method of claim 11, further comprising:
after forming the inner spacer, and immediately prior to epitaxially growing the source/drain feature in the trench, performing a clean process to remove residual portions of inner spacer material from one or more of top surfaces of the semiconductor device, sidewalls of the trench, and a bottom surface of the trench.

13. The method of claim 11, further comprising:
after forming the inner spacer, selectively etching the first, second, and third SiGe layers to form gaps between adjacent channel layers of the plurality of channel layers; and forming a portion of a gate structure within each of the gaps, wherein the portion of the gate structure defines the convex sidewall profile previously defined by the etched first, second, and third SiGe layers.

14. The method of claim 11, wherein the first device type region includes a P-type device region, and wherein the second device type region includes an N-type device region.

15. The method of claim 10, further comprising:
after forming the inner spacer, epitaxially growing a first source/drain feature in the trench within the first device type region while protecting the second device type region with a first dummy spacer layer; and
after epitaxially growing the first source/drain feature, epitaxially growing a second source/drain feature in the trench within the second device type region while protecting the first device type region with a second dummy spacer layer.

16. The method of claim 11, wherein the first SiGe layer has a first etch rate, and wherein the second and third SiGe layers have a second etch rate greater than the first etch rate.

17. A method, comprising:
forming a fin having a first semiconductor layer of a first composition adjacent to a second semiconductor layer of a second composition, wherein the second semiconductor layer of the second composition includes a plurality of constituent layers, and wherein at least two layers of the plurality of constituent layers have different etch rates;
recessing the plurality of constituent layers to form a convex sidewall profile on opposing lateral surfaces of the second semiconductor layer; and
forming an inner spacer that interfaces the convex sidewall profile of the second semiconductor layer along a first inner spacer sidewall surface, wherein the inner spacer has a second inner spacer sidewall surface opposite the first inner spacer sidewall surface, wherein an entirety of the second inner spacer sidewall surface, extending from a first opposing surface of the first semiconductor layer to a second opposing surface of another semiconductor layer of the first composition, defines a first plane, wherein the adjacent first semiconductor layer has a sidewall surface that defines a second plane parallel to the first plane, and wherein the first plane is spaced a distance from the second plane.

18. The method of claim 17, wherein the first composition includes Si, and wherein the second composition includes SiGe.

19. The method of claim 17, further comprising:
after forming the inner spacer, selectively etching the plurality of constituent layers to form a gap adjacent to the first semiconductor layer; and
forming a portion of a gate structure within the gap, wherein the portion of the gate structure defines the convex sidewall profile previously defined by the recessed plurality of constituent layers.

20. The method of claim 17, further comprising:
after forming the inner spacer, epitaxially growing a source/drain feature having a T-shaped feature that contacts the inner spacer along the second inner spacer sidewall surface and that overlaps a lateral end of the adjacent first semiconductor layer.

* * * * *